(12) United States Patent
Abe et al.

(10) Patent No.: US 10,647,507 B2
(45) Date of Patent: May 12, 2020

(54) ARTICLE TRANSPORT FACILITY

(71) Applicant: Daifuku Co., Ltd., Osaka-shi (JP)

(72) Inventors: Takeshi Abe, Hinocho (JP); Kazuya Omori, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 159 days.

(21) Appl. No.: 15/699,070

(22) Filed: Sep. 8, 2017

(65) Prior Publication Data

US 2018/0072498 A1    Mar. 15, 2018

(30) Foreign Application Priority Data

Sep. 9, 2016  (JP) ................................ 2016-176973

(51) Int. Cl.
   *B65G 1/04*    (2006.01)
   *B60L 9/00*    (2019.01)
(52) U.S. Cl.
   CPC .............. *B65G 1/0492* (2013.01); *B60L 9/00* (2013.01)
(58) Field of Classification Search
   CPC ...... B65G 1/0407; B65G 1/0492; B65G 1/04; B60L 9/00; B60L 2200/26; B60L 13/006; B61B 13/04
   See application file for complete search history.

(56) References Cited

U.S. PATENT DOCUMENTS

| | | | |
|---|---|---|---|
| 6,202,831 B1* | 3/2001 | Manthei | H02G 11/006 198/602 |
| 9,242,810 B2* | 1/2016 | Lossov | B65G 63/004 |
| 2015/0336472 A1 | 11/2015 | Tanaka | |
| 2016/0200513 A1* | 7/2016 | Hellenbrand | B65G 1/06 414/280 |

FOREIGN PATENT DOCUMENTS

| | | |
|---|---|---|
| JP | 7184364 A | 7/1995 |
| JP | 20071692 A | 1/2007 |
| JP | 200769996 A | 3/2007 |
| JP | 200863133 A | 3/2008 |
| WO | 2014125727 A1 | 8/2014 |

* cited by examiner

*Primary Examiner* — Glenn F Myers
(74) *Attorney, Agent, or Firm* — The Webb Law Firm

(57) ABSTRACT

A first cable body allows a first transport apparatus to move in a first movement area by deforming as the first transport apparatus moves along a first direction. A second cable body allows a second transport apparatus to move in a second movement area, which at least partially overlaps the first movement area, by deforming as the second transport apparatus moves along the first direction. Assuming that a direction perpendicular to both the first direction and an up-down direction is a second direction, the first cable body and the second cable body are arranged on the same side in the second direction relative to a rail so that the respective arrangement areas in the second direction overlap each other at least partially.

7 Claims, 11 Drawing Sheets

ARTICLE TRANSPORT FACILITY

CROSS-REFERENCE TO RELATED APPLICATION

This application claims priority to Japanese Patent Application No. 2016-176973 filed Sep. 9, 2016, the disclosure of which is hereby incorporated in its entirety by reference.

BACKGROUND OF THE INVENTION

1. Field of the Invention

The present invention relates to an article transport facility that includes a first transport apparatus and a second transport apparatus that are guided by a rail to move in front of a storage rack, a first cable body for power supply or communication that is connected to the first transport apparatus, and a second cable body for power supply or communication that is connected to the second transport apparatus.

2. Description of the Related Art

An article transport facility described in WO 2014/125727A (Patent Document 1) is known as the aforementioned article transport facility. Specifically, the article transport facility described in Patent Document 1 includes a first transport vehicle (4) and a second transport vehicle (5) that travel on a travel rail (10), a first cable guide (8) for supplying power to the first transport vehicle (4), the first cable guide (8) being attached to this transport vehicle (4), and a second cable guide (9) for supplying power to the second transport vehicle (5), the second cable guide (9) being attached to this transport vehicle (5). The first cable guide (8) deforms as the first transport vehicle (4) travels, and the second cable guide (9) deforms as the second transport vehicle (5) travels. In the article transport facility described in Patent Document 1, the first cable guide (8) and the second cable guide (9) are arranged on opposite sides relative to the travel rail (10), thereby avoiding interference between the cable guides (8, 9). That is to say, assuming that a direction perpendicular to both a first direction (a direction in which the rail extends) and an up-down direction is a second direction, in the article transport facility described in Patent Document 1, two cable bodies, namely a first cable body and a second cable body are arranged on opposite sides in the second direction relative to the rail.

SUMMARY OF THE INVENTION

In the case of employing a configuration in which two cable bodies are arranged on opposite sides in the second direction relative to the rail as mentioned above, a cable body arrangement space, for which displacement of the cable bodies due to them deforming is given consideration, needs to be secured on both sides in the second direction relative to the rail. For this reason, with this configuration, an area in the second direction from one cable body arrangement space to the other cable body arrangement space is large. As a result, the facility is likely to increase in size in the second direction. In addition, since the cable body arrangement spaces are present on both sides in the second direction relative to the rail, the number of restrictions is likely to increase regarding the arrangement of other members that are arranged near the floor similarly to the cable bodies. This may also lead to an increase in the size of the facility. In the case of applying a complex arrangement to avoid the cable body arrangement spaces to the other members, there is also concern of an increase in the complexity of the facility. However, these points have not been particularly recognized in Patent Document 1.

It is desired that an article transport facility is realized in which two cable bodies can be arranged while suppressing an increase in the size and complexity of the facility.

An article transport facility according to the present disclosure is an article transport facility including: a storage rack in which a plurality of storage sections for storing articles are arranged in a first direction along a horizontal direction; a rail installed on a floor along the first direction; a first transport apparatus and a second transport apparatus that are guided by the rail to move along the first direction in front of the storage rack and transport the articles to the storage sections or from the storage sections; a first cable body for power supply or communication that is connected to the first transport apparatus and extends in the first direction; and a second cable body for power supply or communication that is connected to the second transport apparatus and extends in the first direction, wherein both a first end, which is an end of the first cable body on a side opposite to a connecting portion thereof connected to the first transport apparatus, and a second end, which is an end of the second cable body on a side opposite to a connecting portion thereof connected to the second transport apparatus, are fixed to the floor, the first cable body allows the first transport apparatus to move in a first movement area, which is an area extending along the first direction, by deforming as the first transport apparatus moves along the first direction, the second cable body allows the second transport apparatus to move in a second movement area, which is an area extending along the first direction and at least partially overlapping the first movement area, by deforming as the second transport apparatus moves along the first direction, and assuming that a direction perpendicular to both the first direction and an up-down direction is a second direction, the first cable body and the second cable body are arranged on the same side in the second direction relative to the rail so that respective areas in which the first cable body and the second cable body are arranged in the second direction at least partially overlap each other.

With this configuration, two cable bodies, namely the first cable body and the second cable body are arranged on the same side in the second direction relative to the rail so that the respective arrangement areas in the second direction overlap each other at least partially. Accordingly, the respective arrangement spaces of the two cable bodies can be collectively placed in a specific area in the second direction, and a reduction in the size of the facility in the second direction is facilitated, compared with the case where the two cable bodies are separately arranged on opposite sides in the second direction relative to the rail. Also, compared with the case where the two cable bodies are separately arranged on opposite sides in the second direction relative to the rail, restrictions regarding the arrangement of other members that are arranged near the floor similarly to the cable bodies can be relaxed. As a result, it is possible to achieve a reduction in the size of the facility and achieve simplification of the facility with a simple arrangement of the other members.

As described above, with the above configuration, it is possible to realize an article transport facility in which two cable bodies can be arranged while suppressing an increase in the size and complexity of the facility.

DETAILED DESCRIPTION OF PREFERRED EMBODIMENTS

Figure 1:
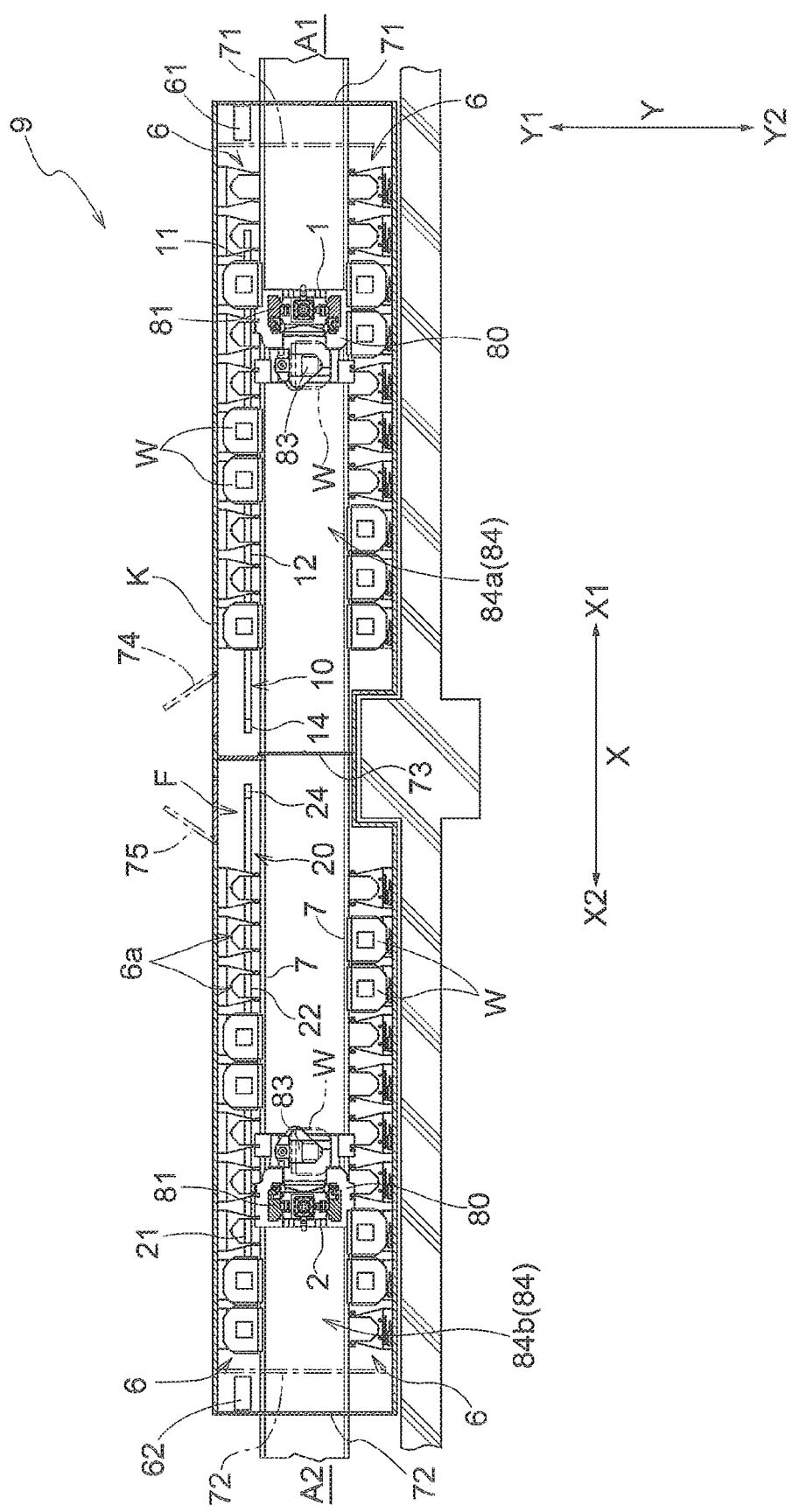
FIG. 1 is a plan view of an article transport facility.
Figure 2:
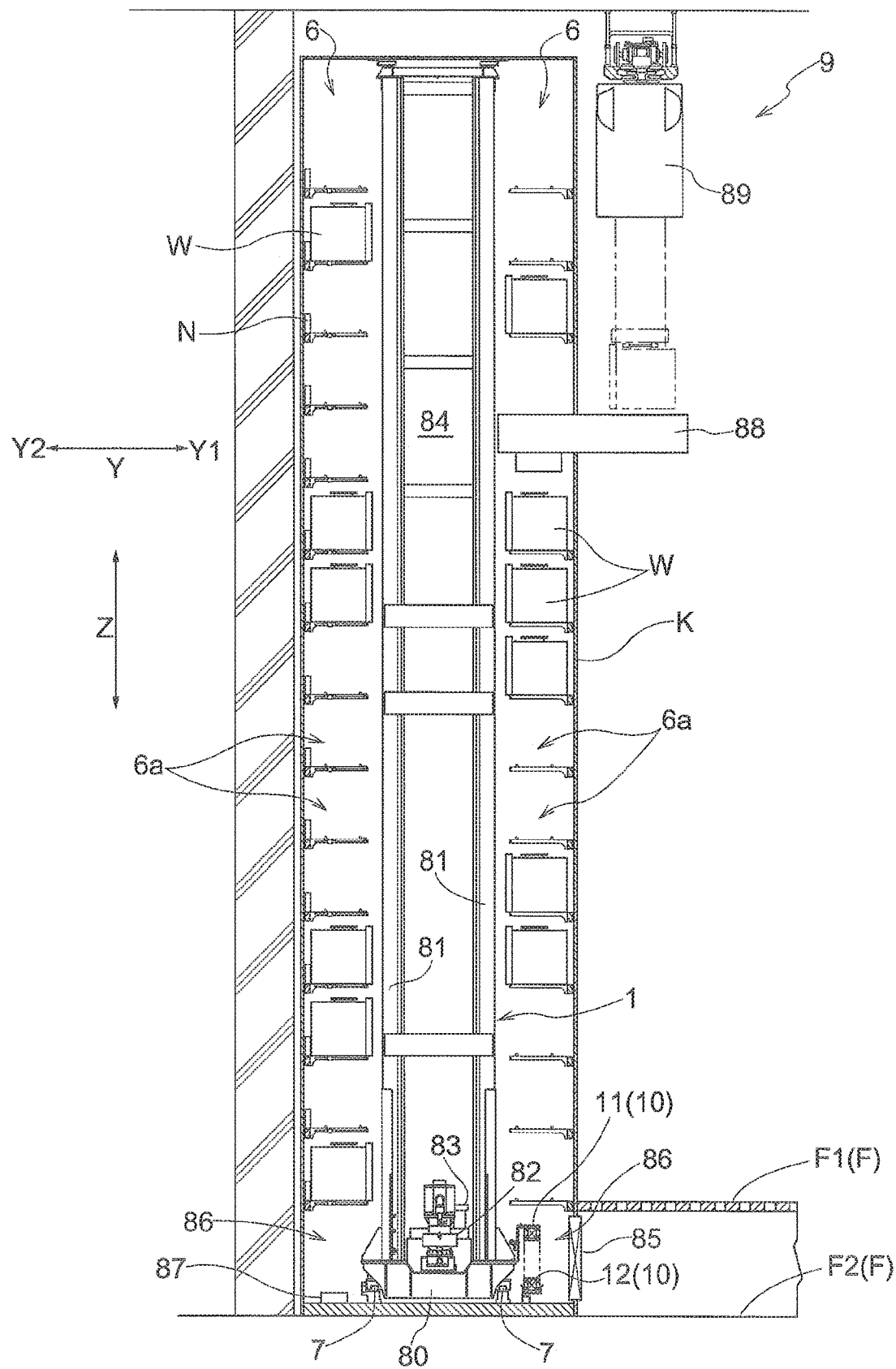
FIG. 2 is a front elevational view of the article transport facility.

An embodiment of an article transport facility will be described with reference to the drawings. As shown in FIGS. 1 and 2, an article transport facility 9 includes storage racks 6, a first transport apparatus 1, a second transport apparatus 2, a first cable body 10, and a second cable body 20. In the storage racks 6, a plurality of storage sections 6a for storing articles W are arranged in a first direction X along a horizontal direction. The first transport apparatus 1 and the second transport apparatus 2 move along the first direction X in front of the storage racks 6, and transport articles W to the storage sections 6a or from the storage sections 6a. Rails 7 are installed along the first direction X on a floor F, on which the article transport facility 9 is installed. The first transport apparatus 1 and the second transport apparatus 2 are guided by the rails 7 to move along the first direction X. Assuming that a space in which at least one of the first transport apparatus 1 and the second transport apparatus 2 move is a "movement path", the rails 7 are installed along the movement path (the longitudinal direction of the movement path).

The storage racks 6 are installed in an orientation in which the front side thereof (the side on which articles W are put into and taken out of the storage sections 6a) coincides with the movement path side. As shown in FIG. 2, in this embodiment, the storage racks 6 are provided with the plurality of storage sections 6a, which are arranged not only in the first direction X but also in an up-down direction Z. The storage sections 6a are each provided with a support portion for supporting an article W. In this embodiment, each of the articles W is a container (specifically, a FOUP (Front Opening Unified Pod)) for accommodating a semiconductor substrate. The storage sections 6a are each provided with a placement body, which serves as a support portion for supporting an article W placed thereon. As shown in FIGS. 1 and 2, in this embodiment, the storage racks 6 are provided on both sides in a second direction Y relative to the movement path. Specifically, assuming that a pair of storage racks 6 arranged so as to oppose each other in the second direction Y with the movement path therebetween is a set, two sets of storage racks 6 are provided side by side in the first direction X. Note that the second direction Y is a direction that is perpendicular to both the first direction X and the up-down direction Z (vertical direction). In the following description, it will be assumed that one side in the second direction Y is a third side Y1, and the side opposite to the third side Y1 (the other side in the second direction Y) is a fourth side Y2. In this embodiment, inert gas supply apparatuses N (see FIG. 2), which supply an inert gas such as nitrogen gas to the articles W (inside of the container) stored in the storage sections 6a, are provided on the storage racks 6 installed on the fourth side Y2 relative to the movement path.

As shown in FIG. 1, the first transport apparatus 1 is arranged on a first side X1, which is one side in the first direction X, relative to the second transport apparatus 2. In the following description, it will be assumed that the side opposite to the first side X1 (the other side in the first direction X) is a second side X2. The first transport apparatus 1 and the second transport apparatus 2 are configured to move along the first direction X at the same position in the second direction Y. Specifically, the first transport apparatus 1 and the second transport apparatus 2 are configured to move along the first direction X at the same position in the second direction Y as a result of being guided by the shared rails 7. For this reason, the positional relationship between the first transport apparatus 1 and the second transport apparatus 2 in the first direction X will not be replaced, and the first transport apparatus 1 is always positioned on the first side X1 relative to the second transport apparatus 2. Also, as shown in FIGS. 1 and 2, in this embodiment, a pair of rails 7 are provided so as to be separate from each other in the second direction Y. The first transport apparatus 1 and the second transport apparatus 2 are guided by the pair of rails 7 to move along the first direction X.

In this embodiment, the first transport apparatus 1 and the second transport apparatus 2 are stacker cranes. Specifically, as shown in FIGS. 1 and 2, the first transport apparatus 1 and the second transport apparatus 2 each include a traveling truck 80, which is guided by the rails 7 (in this embodiment, the pair of rails 7) to travel, masts 81, which are installed upright on the traveling truck 80, a lift body 82, which moves up and down along the masts 81, and a transfer apparatus 83, which is supported by the lift body 82. The transfer apparatus 83 is an apparatus for transferring an article W between a transfer target portion, such as any one of the storage sections 6a, and the transfer apparatus 83 itself. Although the details are omitted, the transfer apparatus 83 is configured to be able to transfer the article W to a storage section 6a on a storage rack 6 arranged on either side in the second direction Y relative to the movement path. In this embodiment, the transfer target portion for the transfer apparatus 83 also includes an internal transfer portion on a later-described conveyer 88 (see FIG. 2). As shown in FIG.

1, in this embodiment, the first transport apparatus 1 has the lift body 82 and the transfer apparatus 83 at a position on the second side X2 relative to the center of the first transport apparatus 1 in the first direction X. The second transport apparatus 2 has the lift body 82 and the transfer apparatus 83 at a position on the first side X1 relative to the center of the second transport apparatus 2 in the first direction X. Accordingly, the position at which the first transport apparatus 1 stops when transferring an article W to a storage section 6a (the position of the center of the first transport apparatus 1 in the first direction X) is on the first side X1 relative to the position at which the second transport apparatus 2 stops when transferring an article W to the same storage section 6a or a storage section 6a arranged at the same position in the first direction X as that storage section 6a (the position of the center of the second transport apparatus 2 in the first direction X).

In this embodiment, the article transport facility 9 is installed in a down-flow clean room in which clean air flows downward from the ceiling side toward the floor. As shown in FIG. 2, the floor F of the clean room is constituted by a lower floor F2 and an upper floor F1, which is arranged above the lower floor F2. The upper floor F1 is a grated floor, in which a plurality of ventilation holes that pass therethrough in the up-down direction Z are formed. The lower floor F2 is a floor that does not have ventilation holes. In this embodiment, the lower floor F2 is made of nonporous concrete. Air that has flown from the ceiling side toward the floor F is discharged via the ventilation holes in the upper floor F1 to an underfloor space, which is formed between the upper floor F1 and the lower floor F2. As shown in FIG. 2, the rails 7 are installed on the lower floor F2.

Also, as shown in FIGS. 1 and 2, in this embodiment, the article transport facility 9 includes a wall body K, a first door 71, a second door 72, a third door 73, a fourth door 74, and a fifth door 75. The wall body K is provided so as to surround the peripheral sides of a transport area 84 in which the storage racks 6 are installed (the periphery as viewed in the up-down direction). The first transport apparatus 1 and the second transport apparatus 2 move along the first direction X within the transport area 84 to transport the articles W. The wall body K is made of a nonporous member. In this embodiment, an opening portion, which is formed at an upper end of the wall body K, is provided with a porous member, and the clean air supplied from the ceiling side flows into the transport area 84 via this porous member. The clean air that has flown into the transport area 84 is discharged to the underfloor space from a gas discharge portion 85, which is provided in a portion of the wall body K below the upper floor F1, together with the inert gas discharged from the articles W (inside of the container) stored in the storage sections 6a.

An opening portion through which the first transport apparatus 1 can pass is formed in a portion of the wall body K that demarcates an end of the transport area 84 on the first side X1. The first door 71 is provided in this opening portion and is configured to be able to open and close the opening portion. A first withdrawal area A1 for performing a maintenance operation on the first transport apparatus 1 is provided on the first side X1 relative to the transport area 84. The rails 7 are installed so as to extend toward the first side X1 beyond the position at which the first door 71 is installed, to the first withdrawal area A1. By switching the first door 71 to an open state, the first transport apparatus 1 can move between the transport area 84 and the first withdrawal area A1. By switching the first door 71 to a closed state, the transport area 84 can be partitioned from the first withdrawal area A1, and air flow between the transport area 84 and the first withdrawal area A1 can be suppressed.

An opening portion through which the second transport apparatus 2 can pass is formed in a portion of the wall body K that demarcates an end of the transport area 84 on the second side X2. The second door 72 is provided in this opening portion and is configured to be able to open and close the opening portion. A second withdrawal area A2 for performing a maintenance operation on the second transport apparatus 2 is provided on the second side X2 relative to the transport area 84. The rails 7 are installed so as to extend toward the second side X2 beyond the position at which the second door 72 is provided, to the second withdrawal area A2. By switching the second door 72 to an open state, the second transport apparatus 2 can move between the transport area 84 and the second withdrawal area A2. By switching the second door 72 to a closed state, the transport area 84 can be partitioned from the second withdrawal area A2, and air flow between the transport area 84 and the second withdrawal area A2 can be suppressed.

An opening portion through which the first transport apparatus 1 and the second transport apparatus 2 can pass is formed in an intermediate portion (in this embodiment, the center portion) in the first direction X in the transport area 84. The third door 73 is provided in this opening portion and is configured to be able to open and close this opening portion. It is assumed here that a portion of the transport area 84 on the first side X1 relative to the position at which the third door 73 is installed is a first transport area 84a, and a portion of the transport area 84 on the second side X2 relative to the position at which the third door 73 is installed is a second transport area 84b. By switching the third door 73 to an open state, the first transport apparatus 1 and the second transport apparatus 2 can move between the first transport area 84a and the second transport area 84b. By switching the third door 73 to a closed state, the first transport area 84a can be partitioned from the second transport area 84b, and air flow between the first transport area 84a and the second transport area 84b can be suppressed. Note that the rails 7 are continuously formed in the first direction X over the entire transport area 84, and are also continuously formed at the boundary between the first transport area 84a and the second transport area 84b. Also, in this embodiment, the rails 7 are also continuously formed at the boundary between the first transport area 84a and the first withdrawal area A1, and are also continuously formed at the boundary between the second transport area 84b and the second withdrawal area A2. As shown in FIG. 1, in this embodiment, a pair of storage racks 6, which oppose each other in the second direction Y with the movement path therebetween, are installed in the first transport area 84a and the second transport area 84b.

An entrance from which an operator enters and exits the first transport area 84a is formed in a portion of the wall body K that demarcates the third side Y1 of the transport area 84 (the first transport area 84a). The fourth door 74 is provided at this entrance and is configured to be able to open and close this entrance. By switching the fourth door 74 to an open state, the operator can enter and exit the first transport area 84a. By switching the fourth door 74 to a closed state, air flow between the first transport area 84a and the outside of the transport area 84 can be suppressed. An entrance where the operator enters and exits the second transport area 84b is also formed in a portion of the wall body K that demarcates the third side Y1 of the transport area 84 (the second transport area 84b). The fifth door 75 is provided at this entrance and is configured to be able to open and close this entrance. By switching the fifth door 75 to an open state, the operator can enter and exit the second transport area 84*b*. By switching the fifth door 75 to a closed state, air flow between the second transport area 84*b* and the outside of the transport area 84 can be suppressed.

As shown in FIG. 2, in this embodiment, the article transport facility 9 includes the conveyer 88, which is provided so as to penetrate the wall body K and transports the articles W placed on the conveyer 88. The conveyer 88 is used for at least either placing the articles W onto the storage racks 6 or taking the articles W out of the storage racks 6. The conveyer 88 is configured to transport the articles W between an external transfer portion, which is located outside the wall body K (outside the transport area 84), and an internal transfer portion, which is located inside the wall body K (inside the transport area 84). A ceiling transport vehicle 89 loads and unloads the articles W onto/from the external transfer portion of the conveyer 88 shown in FIG. 2. A conveyer 88 with an external transfer portion onto/from which the operator loads/unloads the articles W may be provided. The articles W that are to be placed onto the storage racks 6 are placed on the external transfer portion of the conveyer 88 by the ceiling transport vehicle 89 or an operator, and are then transported to the internal transfer portion by the conveyer 88. Thereafter, the articles W are transported from the internal transfer portion to the storage sections 6*a* by the first transport apparatus 1 or the second transport apparatus 2. The articles W that are to be taken out of the storage racks 6 are transported from the storage sections 6*a* onto the internal transfer portion of the conveyer 88 by the first transport apparatus 1 or second transport apparatus 2, and are then transported to the external transfer portion by the conveyer 88. Thereafter, the articles W are unloaded from the external transfer portion by the ceiling transport vehicle 89 or the operator.

As mentioned above, the article transport facility 9 includes the first cable body 10 and the second cable body 20. As shown in FIG. 1, the first cable body 10 is a cable body for power supply or communication that is connected to the first transport apparatus 1 and extends in the first direction X. The second cable body 20 is a cable body for power supply or communication that is connected to the second transport apparatus 2 and extends in the first direction X. In this embodiment, both the first cable body 10 and the second cable body 20 are cable bodies for power supply and communication (cable bodies for both power supply and communication). The first cable body 10 is arranged so that both a later-described first upper portion 11 and first lower portion 12 extend in the first direction X, and is thus arranged so as to mostly extend in the first direction X. The second cable body 20 is arranged so that both later-described second upper portion 21 and second lower portion 22 extend in the first direction X, and is thus arranged so as to mostly extend in the first direction X.

Figure 5:
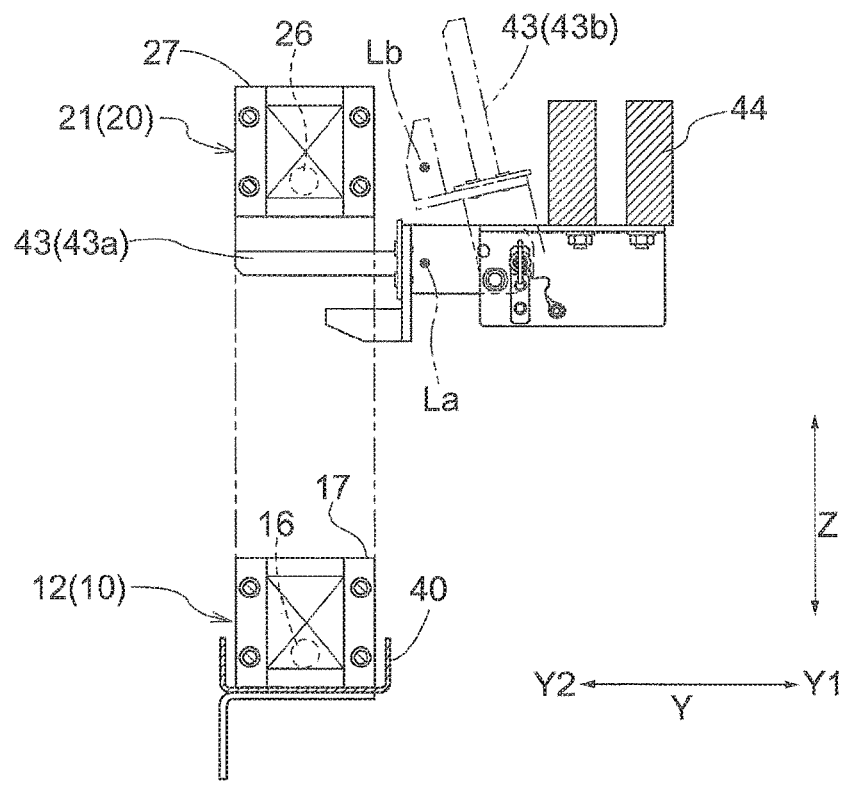
FIG. 5 is a front elevational view of the third support portions.
Figure 6:
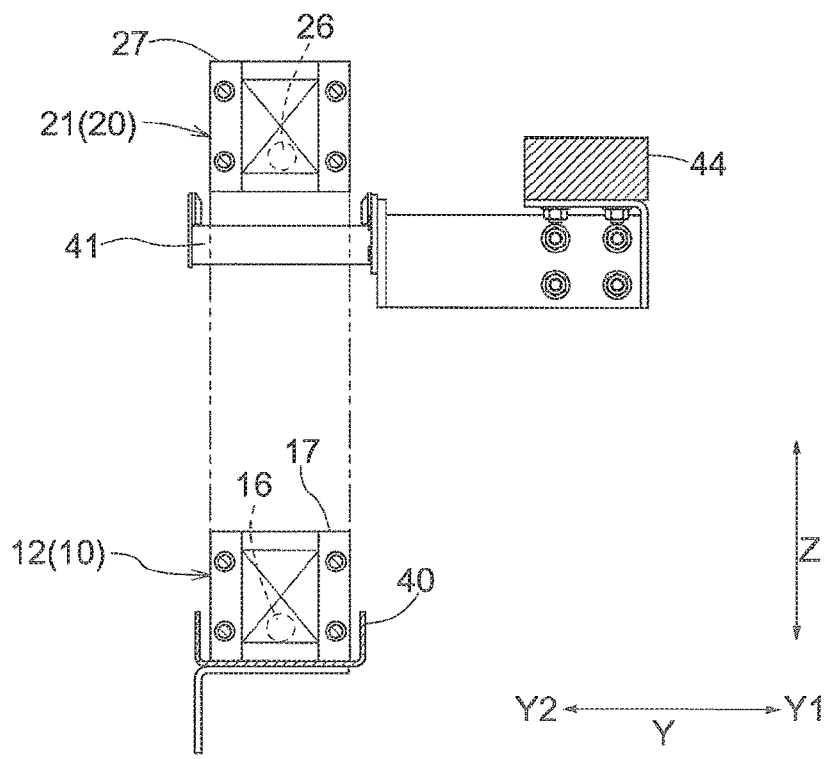
FIG. 6 is a front elevational view of the first support portion.

The first cable body 10 and the second cable body 20 each include a cable main body, and a cable carrier that accommodates the cable main body and restricts the direction in which the cable main body extends. Note that the cable main body may be a single cable, or may be a set of a plurality of cables (e.g. a plurality of signal lines in a bundled state). Specifically, as shown in FIGS. 5 and 6, the first cable body 10 includes first cable main bodies 16, and a first cable carrier 17 for accommodating the first cable main bodies 16 and restricting the direction in which the first cable main bodies 16 extend. The second cable body 20 includes second cable main bodies 26, and a second cable carrier 27 for housing the second cable main bodies 26 and restricting the direction in which the second cable main bodies 26 extend. That is to say, the first cable main bodies 16 and the second cable main bodies 26 each correspond to a "cable main body", and the first cable carrier 17 and the second cable carrier 27 each correspond to a "cable carrier". Although the details are omitted, the cable carrier is configured by linearly connecting a plurality of link bodies. An accommodating space for accommodating a cable main body is formed along the direction in which the cable carrier extends (longitudinal direction), which is defined by the direction in which the plurality of link bodies are arranged (connecting direction). The link bodies are connected so as to be able to pivot relative to each other. The cable carrier is configured so that, when it is bent, the curvature radius in its curved portion is not smaller than a set radius as a result of the link bodies that are adjacent to each other in the extending direction coming into contact with each other. It is thus possible to avoid, when the first cable body 10 or the second cable body 20 deforms, a curved portion with a smaller curvature radius than a tolerable curvature radius from being formed in the first cable main bodies 16 accommodated in the first cable carrier 17 or in the second cable main bodies 26 accommodated in the second cable carrier 27. Note that FIGS. 5 and 6 show the first main bodies 16 and the second cable main bodies 26 in a simplified manner, and do not accurately show the number and cross-sectional shape of respective cable main bodies.

In this embodiment, the first cable body 10 includes a plurality of first cable main bodies 16, which include a first cable main body 16 for power supply, i.e. for supplying power to the first transport apparatus 1, and a communication first cable main body 16 for communication between a control apparatus 8 (see FIG. 15) and the first transport apparatus 1 (communication of control signals, detection signals from sensors, etc.). The first cable carrier 17 accommodates the plurality of first cable main bodies 16. A power source (not shown) and the first transport apparatus 1 are connected by the first cable main body 16 for power supply so that power can be exchanged therebetween. The control apparatus 8 and the first transport apparatus 1 are connected by the first cable main body 16 for communication so that information can be exchanged therebetween. Also, in this embodiment, the second cable body 20 includes a plurality of second cable main bodies 26, which include a second cable main body 26 for power supply, i.e. for supplying power to the second transport apparatus 2, and a communication second cable main body 26 for communication between the control apparatus 8 and the second transport apparatus 2 (communication of control signals, detection signals from sensors, etc.). The second cable carrier 27 accommodates the plurality of second cable main bodies 26. A power source (not shown) and the second transport apparatus 2 are connected by the second cable main body 26 for power supply so that power can be exchanged therebetween. The control apparatus 8 and the second transport apparatus 2 are connected by the second cable main body 26 for communication so that information can be exchanged therebetween.

Figure 3:
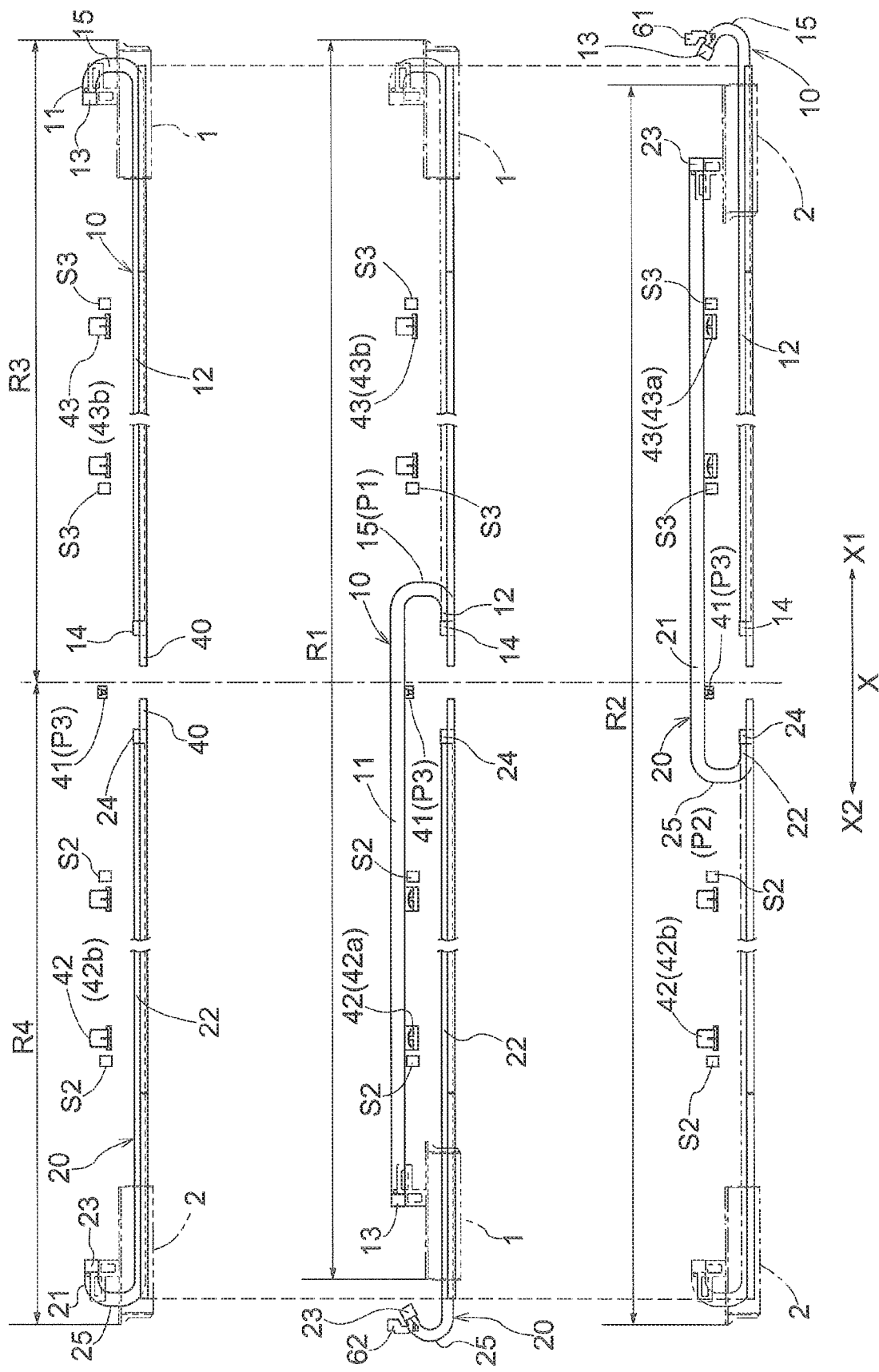
FIG. 3 shows an arrangement configuration of a first support portion, a second support portion, and a third support portion.

As shown in FIG. 3, the first cable body 10 deforms as the first transport apparatus 1 moves along the first direction X, thereby allowing the first transport apparatus 1 to move in a first movement area R1, which is an area extending along the first direction X. The second cable body 20 deforms as the second transport apparatus 2 moves along the first direction X, thereby allowing the second transport apparatus 2 to move in a second movement area R2, which is an area extending along the first direction X and at least partially overlaps the first movement area R1. In this embodiment, the second movement area R2 only partially overlaps the first movement area R1. Specifically, a portion of the second movement area R2 on the first side X1 (in this embodiment, larger part on the first side X1) overlaps a portion of the first movement area R1 on the second side X2 (in this embodiment, larger part on the second side X2). Note that FIG. 3 simplifies the first transport apparatus 1 and the second transport apparatus 2, and mainly shows only the traveling trucks 80 (see FIGS. 1 and 2).

In the center diagram in the up-down direction in FIG. 3, the first transport apparatus 1 in a state of being positioned at the end of the first movement area R1 on the first side X1 is indicated by dash-dot lines, and the first transport apparatus 1 in a state of being positioned at the end of the first movement area R1 on the second side X2 is indicated by dash-double dot lines. As shown in this diagram, the first movement area R1 is defined so as to include the entire area, in the first direction X, of the first transport apparatus 1 (or the traveling truck 80 of the first transport apparatus 1). In the lower diagram in FIG. 3, the second transport apparatus 2 in a state of being positioned at the end of the second movement area R2 on the second side X2 is indicated by dash-dot lines, and the second transport apparatus 2 in a state of being positioned at the end of the second movement area R2 on the first side X1 is indicated by dash-double dot lines. As shown in this diagram, the second movement area R2 is defined so as to include the entire area, in the first direction X, of the second transport apparatus 2 (or the traveling truck 80 of the second transport apparatus 2).

In this embodiment, the first movement area R1 and the second movement area R2 are set so that the articles W can be transferred to any of the plurality of storage sections 6a (see FIG. 1) that are arranged in the first direction X. Specifically, the end of the first movement area R1 on the first side X1 is set to a position at which the first transport apparatus 1 stops when transferring an article W to the storage section 6a arranged at the end on the first side X1 (an end position on the first side X1 of the first transport apparatus 1 or the traveling truck 80). The end of the first movement area R1 on the second side X2 is set to a position at which the first transport apparatus 1 stops when transferring an article W to the storage section 6a arranged at the end on the second side X2 (an end position on the second side X2 of the first transport apparatus 1 or the traveling truck 80). The end of the second movement area R2 on the second side X2 is set to a position at which the second transport apparatus 2 stops when transferring an article W to the storage section 6a arranged at the end on the second side X2 (an end position on the second side X2 of the second transport apparatus 2 or the traveling truck 80). The end of the second movement area R2 on the first side X1 is set to a position at which the second transport apparatus 2 stops when transferring an article W to the storage section 6a arranged at the end on the first side X1 (an end position on the first side X1 of the second transport apparatus 2 or the traveling truck 80). Accordingly, in this embodiment, the first movement area R1 and the second movement area R2 are set to have the same size. As mentioned above, in this embodiment, the position at which the first transport apparatus 1 stops when transferring an article W to a corresponding storage section 6a is on the first side X1 relative to the position at which the second transport apparatus 2 stops when transferring an article W to the same storage section 6a or a storage section 6a arranged at the same position in the first direction X as this storage section 6a. Accordingly, the second movement area R2 is set so as to be shifted toward the second side X2 from the first movement area R1 by the amount of the shift between these stopping positions in the first direction X.

Here, as shown in FIG. 3, with a position within the area in which the first movement area R1 overlaps the second movement area R2 (a position on a dash-dot line extending in the up-down direction in FIG. 3) serving as a reference position, it will be assumed that an area in the first movement area R1 on the first side X1 relative to the reference position is a third movement area R3, and an area in the second movement area R2 on the second side X2 relative to the reference position is a fourth movement area R4. In this embodiment, this reference position is set as a position at which the third door 73 (see FIG. 1) that divides the transport area 84 into the first transport area 84a and the second transport area 84b is installed. Accordingly, in this embodiment, the area in which the first transport apparatus 1 can move when the first transport apparatus 1 is allowed to move throughout the entire transport area 84 is the first movement area R1, and the area in which the first transport apparatus 1 can move when the movable area of the first transport apparatus 1 is restricted to be within the first transport area 84a is the third movement area R3. The area in which the second transport apparatus 2 can move when the second transport apparatus 2 is allowed to move throughout the entire transport area 84 is the second movement area R2, and the area in which the second transport apparatus 2 can move when the movable area of the second transport apparatus 2 is restricted to the second transport area 84b is the fourth movement area R4.

As shown in FIG. 3, a portion of the first cable body 10 that is connected to the first transport apparatus 1 will be referred to as a first connecting portion 13, and an end of the first cable body 10 on the side opposite to the first connecting portion 13 will be referred to as a first end 14. In this embodiment, the first connecting portion 13 is a portion of the first cable carrier 17 that is connected to the first transport apparatus 1, and an end of the first cable body 10 on the side opposite to the first connecting portion 13 is an end of the first cable carrier 17 on the side opposite to the first connecting portion 13. The first cable body 10 has, on the first side X1 relative to the first end 14 and the first connecting portion 13, a first fold-back portion 15, which inverts the direction in which the first cable body 10 (first cable carrier 17) extends from the first end 14 side toward the first connecting portion 13. That is to say, the extending direction moving from the first end 14 toward the first fold-back portion 15 is a direction moving toward the first side X1, and the extending direction moving from the first fold-back portion 15 toward the first connecting portion 13 is a direction moving toward the second side X2. Assuming that, as shown in FIG. 3, a portion of the first cable body 10 between the first fold-back portion 15 and the first connecting portion 13 is a first upper portion 11, and a portion of the first cable body 10 between the first fold-back portion 15 and the first end 14 is a first lower portion 12, in this embodiment, the first upper portion 11 is arranged above the first lower portion 12. Specifically, as shown in FIGS. 1 to 3 and 8, the first upper portion 11 is arranged above the first lower portion 12, at the same position in the second direction Y as the first lower portion 12 (the position at which the first upper portion 11 overlaps the first lower position 12 as viewed in the up-down direction Z).

Also, as shown in FIG. 3, a portion of the second cable body 20 that is connected to the second transport apparatus 2 will be referred to as a second connecting portion 23, and an end of the second cable body 20 on the side opposite to the second connecting portion 23 will be referred to as a second end 24. In this embodiment, the second connecting portion 23 is a portion of the second cable carrier 27 that is connected to the second transport apparatus 2, and an end of the second cable body 20 on the side opposite to the second connecting portion 23 is an end of the second cable carrier 27 on the side opposite to the second connecting portion 23. The second cable body 20 has, on the second side X2 relative to the second end 24 and the second connecting portion 23, a second fold-back portion 25, which inverts the direction in which the second cable body 20 extends from the second end 24 side toward the second connecting portion 23. That is to say, the extending direction moving from the second end 24 toward the second fold-back portion 25 is a direction moving toward the second side X2, and the extending direction moving from the second fold-back portion 25 toward the second connecting portion 23 is a direction moving toward the first side X1. Assuming that, as shown in FIG. 3, a portion of the second cable body 20 between the second fold-back portion 25 and the second connecting portion 23 is a second upper portion 21, and a portion of the second cable body 20 between the second fold-back portion 25 and the second end 24 is a second lower portion 22, in this embodiment, the second upper portion 21 is arranged above the second lower portion 22. Specifically, as shown in FIGS. 1 and 3, the second upper portion 21 is arranged above the second lower portion 22, at the same position in the second direction Y as the second lower portion 22 (the position at which the second upper portion 21 overlaps the second lower position 22 as viewed in the up-down direction Z).

As shown in FIG. 1, both the first end 14 of the first cable body 10 and the second end 24 of the second cable body 20 are fixed to the floor F (in this embodiment, the lower floor F2). For this reason, as shown in FIG. 3, the first cable body 10 deforms so that the position at which the first fold-back portion 15 is formed moves toward the second side X2, as the first transport apparatus 1 moves toward the second side X2. As a result, the length of the first upper portion 11 along the extending direction increases, and the length of the first lower portion 12 along the extending direction decreases. As shown in FIGS. 3 to 6 and 8, a receiving member 40 is provided along the first direction X on the floor F (in this embodiment, the lower floor F2). The receiving member 40 has a support portion, which supports the first lower portion 12 from below, and a pair of walls, which are provided so as to stand upright from both ends of the support portion in the second direction Y. The first lower portion 12 is supported from below by the receiving member 40, in a state where the movement thereof in the second direction Y is restricted. Also, as shown in FIG. 3, the second cable body 20 deforms so that the position at which the second fold-back portion 25 is formed moves toward the first side X1, as the second transport apparatus 2 moves toward the first side X1. As a result, the length of the second upper portion 21 along the extending direction increases, and the length of the second lower portion 22 along the extending direction decreases. Similar to the first lower portion 12, the second lower portion 22 is also supported from below by the receiving member 40, in a state where the movement thereof in the second direction Y is restricted. Note that the first end 14 is fixed to the floor F on the first side X1 relative to the aforementioned reference position (in this embodiment, the position at which the third door 73 is installed), and the second end 24 is fixed to the floor F on the second side X2 relative to the reference position.

As shown in FIG. 1, the first cable body 10 and the second cable body 20 are arranged on the same side in the second direction Y relative to the rails 7 (in this embodiment, the pair of rails 7) so that the areas in which the first cable body 10 and the second cable body 20 are arranged in the second direction Y overlap each other at least partially. In this embodiment, both the first cable body 10 and the second cable body 20 are arranged on the third side Y1 relative to the rails 7 (in this embodiment, the pair of rails 7). The first cable body 10 and the second cable body 20 are arranged at the same position in the second direction Y. That is to say, in this embodiment, the area in which the first cable body 10 is arranged in the second direction Y coincides with the area in which the second cable body 20 is arranged in the second direction Y. Note that, in this embodiment, the length of the first cable body 10 along its extending direction from the first end 14 to the first connecting portion 13 is equal to the length of the second cable body 20 along its extending direction from the second end 24 to the second connecting portion 23. That is to say, in this embodiment, cable carriers having the same length along the extending direction are used as the first cable carrier 17 and the second cable carrier 27.

As shown in FIG. 2, in this embodiment, the first cable body 10 and the second cable body 20 are arranged in a lower space 86, which is formed below the lowermost storage section 6a (a space between the lowermost storage section 6a and the floor F (lower floor F2)). As mentioned above, in this embodiment, both the first cable body 10 and the second cable body 20 are arranged on the third side Y1 relative to the rails 7 (in this embodiment, the pair of rails 7; this will also apply to the following description). Thus, neither the first cable body 10 nor the second cable body 20 is arranged in the lower space 86 formed on the fourth side Y2 relative to the rails 7. This configuration allows other members to be arranged in a simple arrangement in the lower space 86 formed on the fourth side Y2 relative to the rails 7. As shown in FIG. 2, in this embodiment, a duct 87 is arranged along the first direction X in the lower space 86 formed on the fourth side Y2 relative to the rails 7. In the example shown in FIG. 2, the duct 87 is fixed to the floor F (lower floor F2). For example, a communication cable for performing communication between the control apparatus 8 and the inert gas supply apparatus N, the conveyer 88, and the like, a gas supply pipe for supplying an inert gas to the inert gas supply apparatus N, a power supply cable for supplying power for operation to the inert gas supply apparatus N, the conveyer 88, and the like, are accommodated within the duct 87.

Incidentally, as the first transport apparatus 1 moves toward the second side X2, the length of the first upper portion 11 along the extending direction increases, and an intermediate portion of the first upper portion 11 in the extending direction is more likely to sag under its own weight. As the second transport apparatus 2 moves toward the first side X1, the length of the second upper portion 21 along the extending direction increases, and an intermediate portion of the second upper portion 21 in the extending direction is more likely to sag under its own weight. In view of this point, in this embodiment, the article transport facility 9 includes a first support portion 41 at a third position P3, which is a position between a first position P1 and a second position P2, to support the first upper portion 11 from below when the first transport apparatus 1 is positioned on the second side X2 relative to the third position P3, and to support the second upper portion 21 from below when the second transport apparatus 2 is positioned on the first side X1 relative to the third position P3, as shown in FIG. 3. Here, the first position P1 is a position in the first direction X of the first fold-back portion 15 when the first transport apparatus 1 is positioned at the end of the first movement area R1 on the second side X2 (see the center diagram in the up-down direction in FIG. 3), and the second position P2 is a position in the first direction X of the second fold-back portion 25 when the second transport apparatus 2 is positioned at the end of the second movement area R2 on the first side X1 (see the lower diagram in the in FIG. 3). The first position P1 is a position on the first side X1 relative to the second position P2. As a result of providing this first support portion 41, the first upper portion 11 can be supported from below by the first support portion 41 provided at the third position P3 when the first transport apparatus 1 is positioned on the second side X2 relative to the third position P3, and the second upper portion 21 can be supported from below by the first support portion 41 provided at the third position P3 when the second transport apparatus 2 is positioned on the first side X1 relative to the third position P3. As a result, it is possible for the first upper portion 11 and the second upper portion 21 to avoid coming into contact with the floor F or other members arranged on the floor F.

FIG. 6 shows a situation where, with the second transport apparatus 2 positioned on the first side X1 relative to the third position P3, the first support portion 41 is arranged so as to be positioned below the second upper portion 21 to be able to support the second upper portion 21 from below. Although FIG. 6 shows a situation where the first support portion 41 is separate from the second upper portion 21, the second upper portion 21 is supported from below by the first support portion 41 when a portion of the second upper portion 21 at the third position P3 has lowered to the height of the first support portion 41. Note that the first support portion 41 has the support portion for supporting the first upper portion 11 and the second upper portion 21 from below, and the pair of walls that are provided so as to stand upright from both ends of the support portion in the second direction Y. The first upper portion 11 and the second upper portion 21 are supported from below by the first support portion 41, in a state where their movement in the second direction Y is restricted.

Figure 4:
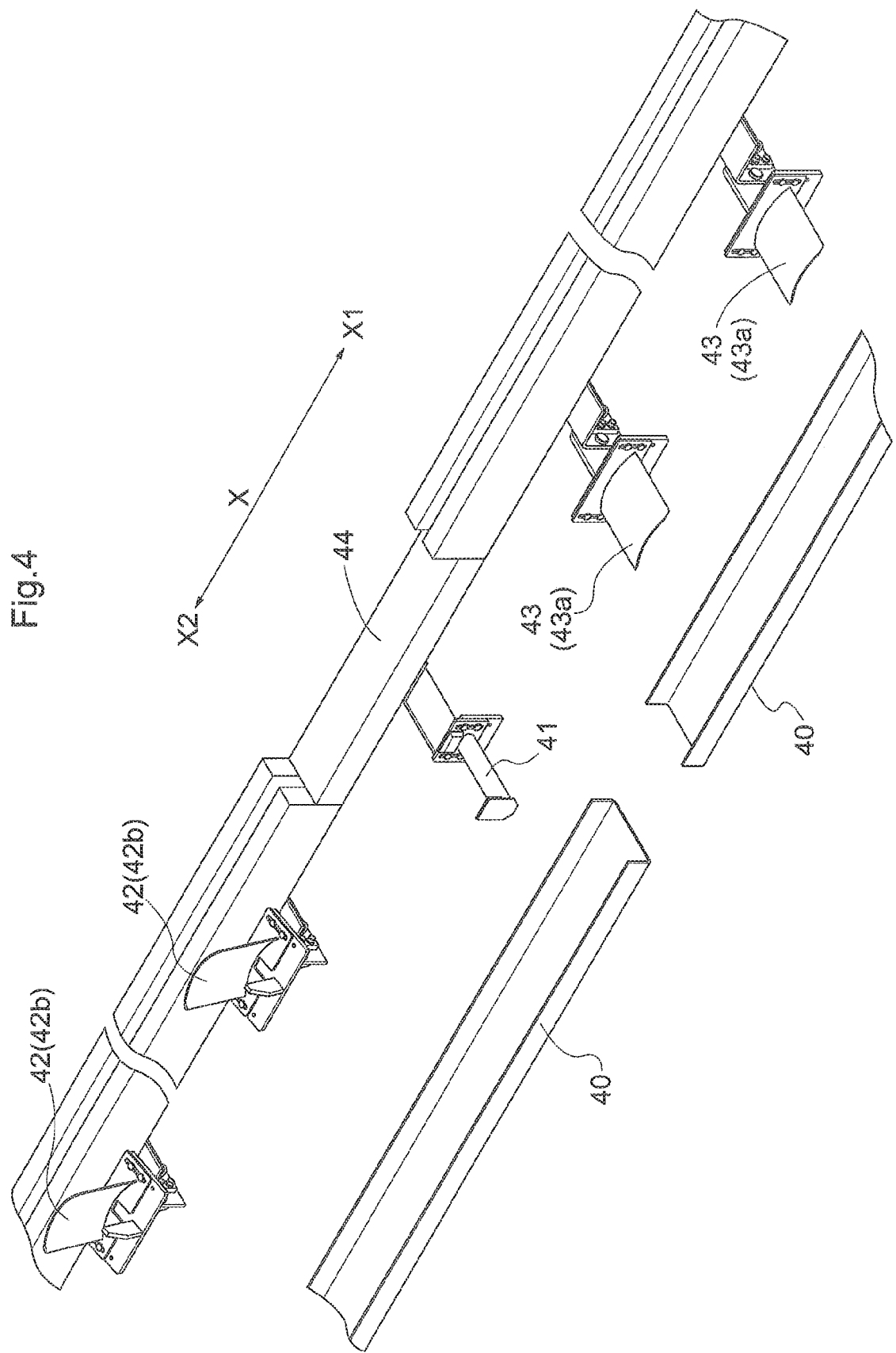
FIG. 4 is a perspective view of the first support portion, second support portions, and third support portions.

As shown in FIG. 3, in this embodiment, the aforementioned reference position (the position indicated by a dash-dot line extending in the up-down direction in FIG. 3; in this embodiment, the position at which the third door 73 is installed) is a position between the first position P1 and the second position P2. In this embodiment, the third position P3 is set to a position between the first position P1 and the second position P2, the position being shifted in the first direction X from the reference position (in this embodiment, a position shifted toward the second side X2), and thus interference between the third door 73 and the first support portion 41 that is installed at the third position P3 is avoided. Thus, as shown in FIGS. 4 and 6, the first support portion 41 may be one whose orientation and installation position are fixed relative to a fixation member 44. Note that the fixation member 44 is a member for supporting the first support portion 41 as well as later-described second support portions 42 and third support portions 43. In this embodiment, the fixation member 44 is fixed to a frame body that constitutes the storage racks 6.

In this embodiment, as shown in FIGS. 3 and 4, the article transport facility 9 includes the second support portions 42, which support the first upper portion 11 from below on the upper side of the second lower portion 22 when the first transport apparatus 1 is positioned on the second side X2 relative to the second position P2, and the third support portions 43, which support the second upper portion 21 from below on the upper side of the first lower portion 12 when the second transport apparatus 2 is positioned on the first side X1 relative to the first position P1. In this embodiment, the first cable body 10 and the second cable body 20 are arranged at the same position in the second direction Y. For this reason, as shown in the center diagram in the up-down direction in FIG. 3, the first upper portion 11 is arranged above the second lower portion 22 so as to overlap the second lower portion 22 as viewed in the up-down direction Z when the first transport apparatus 1 is positioned on the second side X2 relative to the second position P2. However, by supporting the first upper portion 11 from below using the aforementioned second support portions 42, contact between the first upper portion 11 and the second lower portion 22 can be avoided. Also, as shown in the lower diagram in FIG. 3, the second upper portion 21 is arranged above the first lower portion 12 so as to overlap the first lower portion 12 as viewed in the up-down direction Z when the second transport apparatus 2 is positioned on the first side X1 relative to the first position P1. However, by supporting the second upper portion 21 from below using the aforementioned third support portions 43, contact between the second upper portion 21 and the first lower portion 12 can be avoided.

Note that, as shown in FIG. 3, the second support portions 42 are arranged on the second side X2 relative to the second position P2, and the third support portions 43 are arranged on the first side X1 relative to the first position P1. In this embodiment, the first cable body 10 and the second cable body 20 are arranged at the same position in the second direction Y. Accordingly, when supporting the first upper portion 11 from below, the second support portions 42 are located within a second movement space, in which the second fold-back portion 25 moves when the second transport apparatus 2 moves in the second movement area R2. When supporting the second upper portion 21 from below, the third support portions 43 are located within a first movement space, in which the first fold-back portion 15 moves when the first transport apparatus 1 moves in the first movement area R1. In view of this point, in this embodiment, the second support portions 42 are configured so that at least one of the posture and installation position thereof can be switched between a second support position 42a, which is within the second movement space and at which the second support portions 42 support the first upper portion 11 from below, and a second withdrawal position 42b, which is outside the second movement space. Also, in this embodiment, the third support portions 43 are configured so that at least one of the posture and installation position thereof can be switched between a third support position 43a, which is within the first movement space and at which the third support portions 43 support the second upper portion 21 from below, and a third withdrawal position 43b, which is outside the first movement space. With this configuration, by switching the positions of the second support portions 42 to the second withdrawal position 42b when the second transport apparatus 2 moves in the second movement area R2, interference between the second support portions 42 and the second cable body 20 can be avoided. Also, by switching the positions of the third support portions 43 to the third withdrawal position 43b when the first transport apparatus 1 moves in the first movement area R1, interference between the third support portions 43 and the first cable body 10 can be avoided.

In this embodiment, the positions at which the second support portions 42 are installed are fixed. The positions of the second support portions 42 are switched between the second support position 42a and the second withdrawal position 42b by switching the orientation of the second support portions 42. Also, in this embodiment, the positions at which the third support portions 43 are installed are fixed. The positions of the third support portions 43 are switched between the third support position 43a and the third withdrawal position 43b by switching the orientation of the third support portions 43. Specifically, as shown in FIG. 5, the third support portions 43 are supported by the fixation member 44 so as to be able to pivot around a pivot axis which extends along the first direction X. The positions of the third support portions 43 are switched between the third support position 43a and the third withdrawal position 43b by pivoting the third support portions 43 around this pivot axis. Note that FIG. 5 shows a situation where, in a state where the second transport apparatus 2 is positioned on the first side X1 relative to the first position P1, the third support portions 43 positioned at the third support position 43a are arranged so as to be able to support the second upper portion 21 from below on the upper side of the first lower portion 12. FIG. 5 shows a situation where a third support portion 43 positioned at the third support position 43a is separate from the second upper portion 21. However, the second upper portion 21 is supported from below by the third support portion 43 when a portion of the second upper portion 21 that is positioned at the position at which the third portion 43 is arranged has been lowered to the height of the third support portions 43.

The second support portions 42 are configured similar to the third support portions 43, except for the installation position in the first direction X. Specifically, the second support portions 42 are supported by the fixation member 44 so as to be able to pivot round a pivot axis which extends along the first direction X. The position of each second support portion 42 is switched between the second support position 42a and the second withdrawal position 42b by pivoting the second support portion 42 around this pivot axis. Note that the pivoting of the second support portions 42 and the pivoting of the third support portions 43 are manually performed by the operator, or is automatically performed under the control of the control apparatus 8.

In this embodiment, the article transport facility 9 includes the second support portions 42 at a plurality of positions on the second side X2 relative to the second position P2, and the third support portions 43 at a plurality of positions on the first side X1 relative to the first position P1. Specifically, although not shown in the diagrams, the second support portions 42 are provided at three positions on the second side X2 relative to the second position P2 in one-to-one correspondence, and the third support portions 43 are provided at three positions on the first side X1 relative to the first position P1 in one-to-one correspondence. The second support positions 42a of the plurality of second support portions 42 are set to the same position except for the installation position in the first direction X. The second withdrawal positions 42b of the plurality of second support portions 42 are set to the same position except for the installation position in the first direction X. The third support positions 43a of the plurality of third support portions 43 are set to the same position except for the installation position in the first direction X. The third withdrawal positions 43b of the plurality of third support portions 43 are set to the same position except for the installation position in the first direction X.

Figure 15:
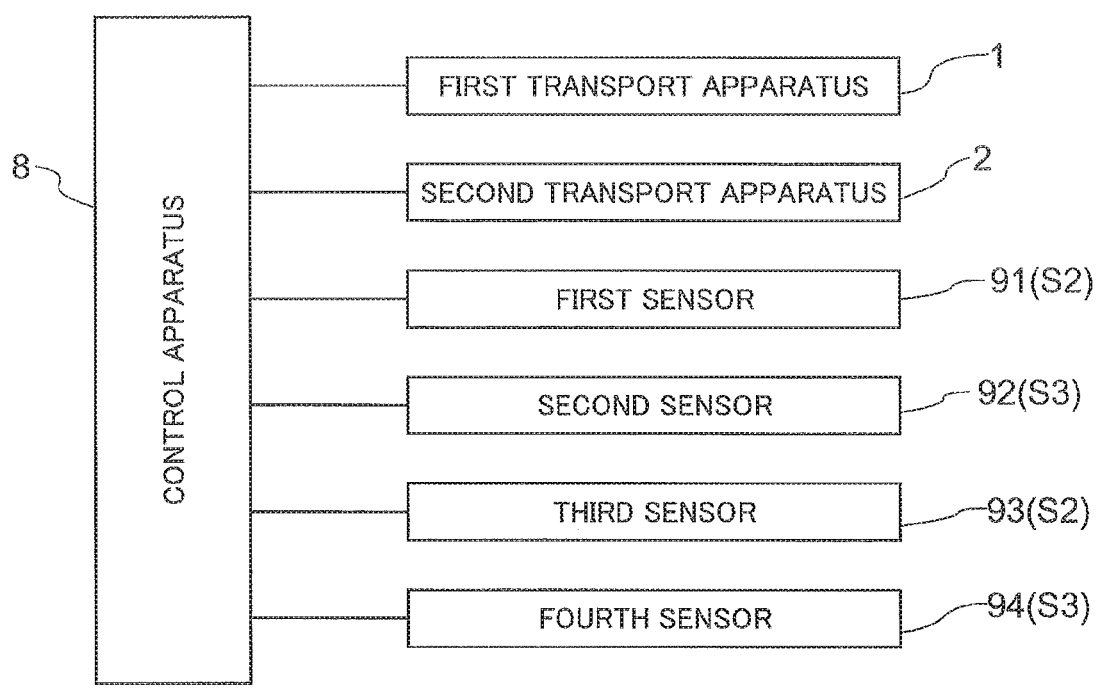
FIG. 15 is a control block diagram.

In this embodiment, as shown in FIG. 15, the article transport facility 9 includes a first sensor 91 for projecting a detection light beam in the first direction X and detecting that at least one of the second support portions 42 is positioned at the second support position 42a, and a second sensor 92 for projecting a detection light beam in the first direction X and detecting that at least one of the third support portions 43 is positioned at the third support position 43a. Furthermore, in this embodiment, the article transport facility 9 includes a third sensor 93 for projecting a detection light beam in the first direction X and detecting that at least one of the second support portions 42 is positioned at the second withdrawal position 42b, and a fourth sensor 94 for projecting a detection light beam in the first direction X and detecting that at least one of the third support portions 43 is positioned at the third withdrawal position 43b, as shown in FIG. 15. Detection information from the first sensor 91, the second sensor 92, the third sensor 93, and the fourth sensor 94 is set to be input to the control apparatus 8.

Both the first sensor 91 and the third sensor 93 are second support portion sensors S2 for detecting the positions of the second support portions 42. FIG. 3 shows both the first sensor 91 and the third sensor 93 as the second support portion sensors S2 without distinguishing therebetween. Both the second sensor 92 and the fourth sensor 94 are third support portion sensors S3 for detecting the positions of the third support portions 43. FIG. 3 shows both the second sensor 92 and the fourth sensor 94 as the third support portion sensors S3 without distinguishing therebetween. As shown in FIG. 3, in this embodiment, the second support portion sensors S2 (the first sensor 91 and the third sensor 93) each has a pair of elements, which are arranged opposing each other in the first direction X with all second support portions 42 therebetween. One of the pair of elements is a light-projection element for projecting a detection light beam in the first direction X, and the other one of the pair of elements is a light-receiving element for receiving the detection light beam projected from the light-projection element. That is to say, in this embodiment, the second support portion sensors S2 are photosensors of a light-blocking type that detect the presence of an object due to the absence of the detection light beam.

Specifically, a light projection axis of the light-projection element of the first sensor 91 is set at a position where the detection light beam is blocked by the second support portion 42 or a member that moves integrally with the second support portion 42 if a second support portion 42 is positioned at the second support position 42a, and where the detection light beam reaches the light-receiving element if a second support portion 42 is positioned at the second withdrawal position 42b. Accordingly, if the detection light beam is not received by the light-receiving element of the first sensor 91, it can be determined that at least one of the second support portions 42 is positioned at the second support position 42a. A light projection axis of the light-projection element of the third sensor 93 is set at a position where the detection light beam is blocked by the second support portion 42 or a member that moves integrally with the second support portion 42 if a second support portion 42 is positioned at the second withdrawal position 42b, and where the detection light beam reaches the light-receiving element if a second support portion 42 is positioned at the second support position 42a. Accordingly, if the detection light beam is not received by the light-receiving element of the third sensor 93, it can be determined that at least one of the second support portions 42 is positioned at the second withdrawal position 42b.

Also, as shown in FIG. 3, in this embodiment, the third support portion sensors S3 (the second sensor 92 and the fourth sensor 94) each has a pair of elements, which are arranged opposing each other in the first direction X with all third support portions 43 therebetween. One of the pair of elements is a light-projection element for projecting a detection light beam in the first direction X, and the other one of the pair of elements is a light-receiving element for receiving the detection light beam projected from the light-projection element. That is to say, in this embodiment, the third support portion sensors S3 are photosensors of a light-blocking type that detect the presence of an object due to the absence of the detection light beam.

Specifically, a light projection axis of the light-projection element of the second sensor 92 is set at a position (the position denoted by "La" in FIG. 5) where the detection light beam is blocked by the third support portion 43 or a member that moves integrally with the third support portion 43 if a third support portion 43 is positioned at the third support position 43a, and where the detection light beam reaches the light-receiving element if a third support portion 43 is positioned at the third withdrawal position 43b. Accordingly, if the detection light beam is not received by the light-receiving element of the second sensor 92, it can be determined that at least one of the third support portions 43 is positioned at the third support position 43a. A light projection axis of the light-projection element of the fourth sensor 94 is set at a position (the position denoted by "Lb" in FIG. 5) where the detection light beam is blocked by the third support portion 43 or a member that moves integrally with the third support portion 43 if a third support portion 43 is positioned at the third withdrawal position 43b, and where the detection light beam reaches the light-receiving element if a third support portion 43 is positioned at the third support position 43a. Accordingly, if the detection light beam is not received by the light-receiving element of the fourth sensor 94, it can be determined that at least one of the third support portions 43 is positioned at the third withdrawal position 43b.

Figure 8:
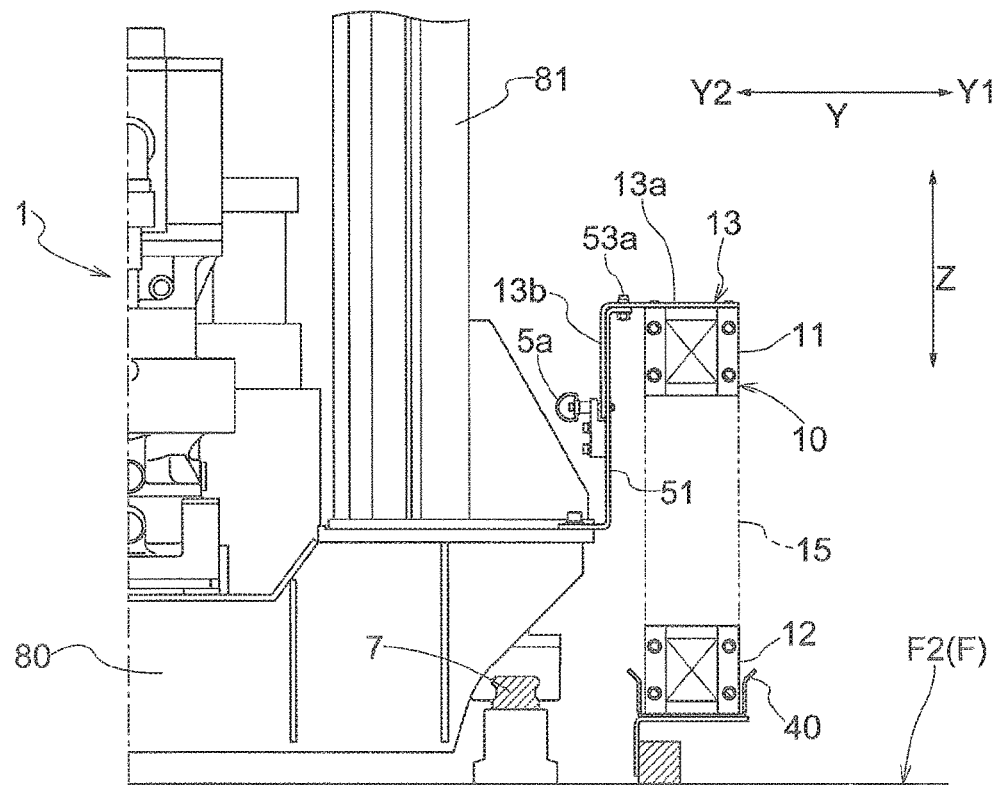
FIG. 8 is a partial front elevational view of the first transport apparatus.

As mentioned above, the first withdrawal area A1 is provided on the first side X1 relative to the transport area 84, and the second withdrawal area A2 is provided on the second side X2 relative to the transport area 84. The first withdrawal area A1 is provided on the first side X1 relative to the first movement area R1 and the second movement area R2. Accordingly, the first withdrawal area A1 is an area in which the first transport apparatus 1 can be moved with the first connecting portion 13 removed from the first transport apparatus 1 (later-described first attachment portion 51). That is to say, the first connecting portion 13 of the first cable body 10 is configured to be able to be attached to and removed from the first attachment portion 51, which is fixed to the first transport apparatus 1. The first connecting portion 13 is configured to be removed from the first attachment portion 51 when the first transport apparatus 1 is moved to the first withdrawal area A1. Note that, when the first connecting portion 13 is removed from the attachment portion 51, portions (connectors, terminals etc.) of the first cable main bodies 16 that are connected to the first transport apparatus 1 are also removed from attachment portions (connectors, terminal bases etc.) provided in the first transport apparatus 1. As shown in FIG. 8, in this embodiment, the first attachment portion 51 is fixed to an end, on the third side Y1, of the traveling truck 80 of the first transport apparatus 1.

The second withdrawal area A2 is provided on the second side X2 relative to the first movement area R1 and the second movement area R2. Accordingly, the second withdrawal area A2 is an area in which the second transport apparatus 2 can be moved with the second connecting portion 23 removed from the second transport apparatus 2 (later-described second attachment portion 52). That is to say, the second connecting portion 23 of the second cable body 20 is configured to be able to be attached to and removed from the second attachment portion 52, which is fixed to the second transport apparatus 2. The second connecting portion 23 is configured to be removed from the second attachment portion 52 when the second transport apparatus 2 is moved to the second withdrawal area A2. Note that, when the second connecting portion 23 is removed from the second attachment portion 52, portions (connectors, terminals etc.) of the second cable main bodies 26 that are connected to the second transport apparatus 2 are also removed from attachment portions (connectors, terminal bases etc.) provided in the second transport apparatus 2. In this embodiment, the second attachment portion 52 is fixed to an end, on the third side Y1, of the traveling truck 80 of the second transport apparatus 2.

As shown in FIGS. 1 and 3, the article transport facility 9 is provided with a first holder 61, which holds the first connecting portion 13 in a state of having been removed from the first attachment portion 51, and a second holder 62, which holds the second connecting portion 23 in a state of having been removed from the second attachment portion 52. In this embodiment, the first holder 61 is provided at an end of the transport area 84 on the first side X1, and the second holder 62 is provided at an end of the transport area 84 on the second side X2. Also, in this embodiment, both the first holder 61 and the second holder 62 are arranged on the third side Y1 relative to the rails 7 (in this embodiment, the pair of rails 7). In this embodiment, the first holder 61 and the second holder 62 are fixed to the frame body that constitutes the storage racks 6.

The first holder 61 holds the first connecting portion 13 so that, when the second transport apparatus 2 moves throughout the entire second movement area R2, the first cable body 10 is arranged in an orientation in which it does not interfere with the second transport apparatus 2 and the second cable body 20. With this configuration, it is possible to avoid interruption by the first cable body 10 in a state of having been removed from the first transport apparatus 1 (first attachment portion 51) of the movement of the second transport apparatus 2 in the second movement area R2. In this embodiment, as shown in the lower diagram in FIG. 3, the orientation of the first cable body 10 with the first connecting portion 13 held by the first holder 61 is an orientation in which the first fold-back portion 15 and the first connecting portion 13 are arranged outside (on the first side X1 of) the second movement area R2, and a portion of the first lower portion 12 that is arranged in the second movement area R2 is arranged along the floor F (lower floor F2). In this embodiment, the first lower portion 12 is arranged along the floor F (lower floor F2), in a state of being supported from below by the receiving member 40.

The second holder 62 holds the second connecting portion 23 so that, when the first transport apparatus 1 moves throughout the entire first movement area R1, the second cable body 20 is arranged in an orientation in which it does not interfere with the first transport apparatus 1 and the first cable body 10. With this configuration, it is possible to avoid interruption by the second cable body 20 in a state of having been removed from the second transport apparatus 2 (second attachment portion 52) of the movement of the first transport apparatus 1 in the first movement area R1. In this embodiment, as shown in the center diagram in the up-down direction in FIG. 3, the orientation of the second cable body 20 with the second connecting portion 23 held by the second holder 62 is an orientation in which the second fold-back portion 25 and the second connecting portion 23 are arranged outside (on the second side X2 of) the first movement area R1, and a portion of the second lower portion 22 that is arranged in the first movement area R1 is arranged along the floor F (lower floor F2). In this embodiment, the second lower portion 22 is arranged along the floor F (lower floor F2), in a state of being supported from below by the receiving member 40.

As will be described later, in this embodiment, the article transport facility 9 is provided with a first pin for positioning the first connecting portion 13 relative to the first attachment portion 51, and a second pin for positioning the second connecting portion 23 relative to the second attachment portion 52. The first pin is configured to be able to be inserted into and removed from an insertion hole, which is provided in at least one of the first attachment portion 51 and the first connecting portion 13. The second pin is configured to be able to be inserted into and removed from an insertion hole, which is provided in at least one of the second attachment portion 52 and the second connecting portion 23.

Figure 7:
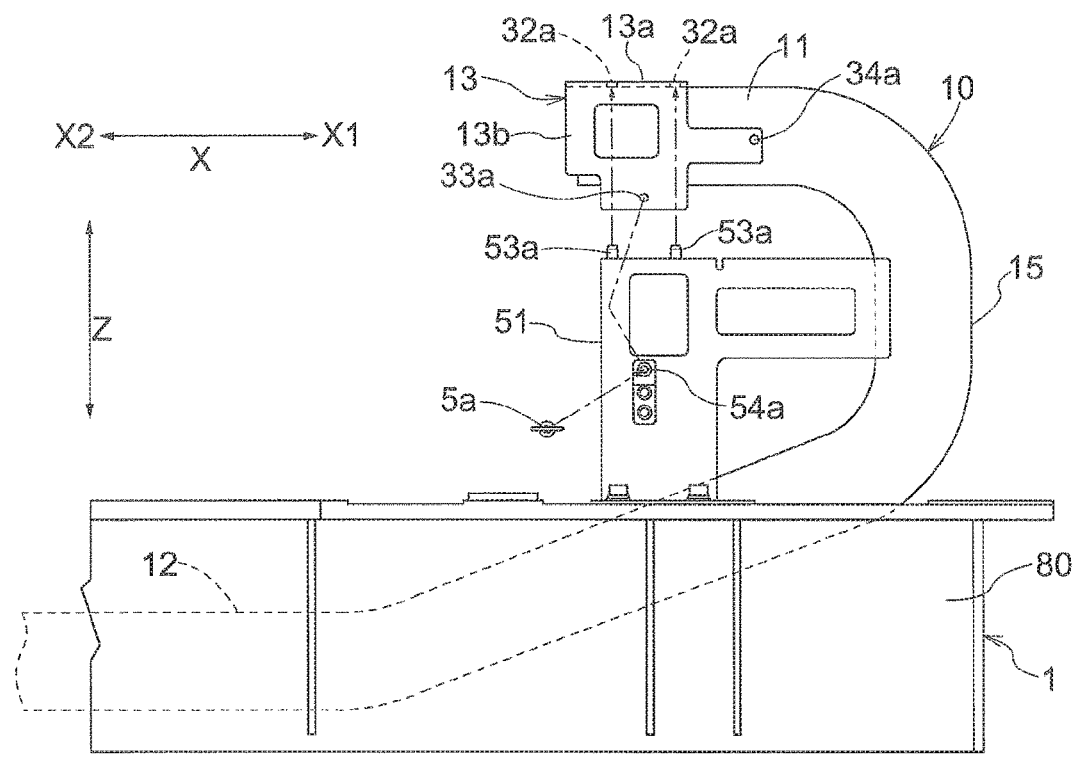
FIG. 7 is a side view showing a structure in which a first connecting portion is attached to a first attachment portion.

Specifically, as shown in FIGS. 7 and 8, the first attachment portion 51 includes first fixing pins 53a and a first attachment insertion hole 54a. The first attachment portion 51 includes a pin forming portion at which the first fixing pins 53a are formed. The first fixing pins 53a are formed in a cylindrical shape projecting upward from an upper flat face of the pin forming portion. In this embodiment, two first fixing pins 53a are formed so as to be arranged in the first direction X. The first attachment portion 51 includes a plate-shaped portion, which connects a portion to be fixed to the first transport apparatus 1 (traveling truck 80) to the aforementioned pin forming portion. The first attachment insertion hole 54a is formed so as to penetrate the plate-shaped portion. In this embodiment, the first attachment insertion hole 54a is also formed in a member attached to a portion of the plate-shaped portion at which the first attachment insertion hole 54a is formed. These two first attachment insertion holes 54a are formed so that their positions in a plane parallel to the plate surface of the plate-shaped portion are the same, and so as to be separate from each other in a direction perpendicular to the plate surface of the plate-shaped portion. In this embodiment, the pin forming portion is arranged so that the upper face is parallel to a horizontal plane, and the plate-shaped portion is arranged so that the plate surface is parallel to a plane perpendicular to the second direction Y.

As shown in FIGS. 7 and 8, the first connecting portion 13 includes first fixing-pin insertion holes 32a, a first insertion-pin insertion hole 33a, and a first holding insertion hole 34a. The first connecting portion 13 includes a first portion 13a, which has a plate shape and is arranged parallel to a horizontal plane when the direction in which the first cable body 10 extends at the first connecting portion 13 is the horizontal direction. The first fixing-pin insertion holes 32a are formed so as to penetrate the first portion 13a. In this embodiment, two first fixing-pin insertion holes 32a are formed so as to be arranged in the first direction X. The distance by which the two first fixing-pin insertion holes 32a are separate from each other in the first direction X coincides with the distance by which the aforementioned two first fixing pins 53a are separate from each other in the first direction X. The first connecting portion 13 also includes a second portion 13b, which has a plate shape and extends downward from the first portion 13a. The first insertion-pin insertion hole 33a and the first holding insertion hole 34a are formed so as to penetrate the second portion 13b at different positions.

When the first connecting portion 13 is attached to the first attachment portion 51, first, the first connecting portion 13 is arranged relative to the first attachment portion 51 so that the first fixing pins 53a are inserted into the first fixing-pin insertion holes 32a. In this embodiment, the first connecting portion 13 is arranged relative to the first attachment portion 51 so that the first fixing pins 53a are inserted to the respective first fixing-pin insertion holes 32a. In this embodiment, since an upper face of the pin forming portion (the portion in which the first fixation pins 53a are formed) of the first attachment portion 51 is arranged parallel to a horizontal plane, the first portion 13a of the first connecting portion 13 is also arranged parallel to a horizontal plane. That is to say, the first connecting portion 13 is arranged so that the direction in which the first cable body 10 extends at the first connecting portion 13 is the horizontal direction. The direction in which the first fixing pins 53a are inserted into the first fixing-pin insertion holes 32a is a direction parallel to the up-down direction Z. Accordingly, as a result of the first fixing pins 53a being fitted to the respective first fixing-pin insertion holes 32a, horizontal movement relative to the first attachment portion 51 and rotational movement around an axis in the up-down direction Z of the first connecting portion 13 are restricted. By inserting, in this state, the first insertion pin 5a into both the first attachment insertion holes 54a and the first insertion-pin insertion hole 33a in the horizontal direction (a direction along the second direction Y), up-down movement of the first connecting portion 13 relative to the first attachment portion 51 is also restricted. As a result, the first connecting portion 13 enters a state of being positioned in all directions relative to the first attachment portion 51. Note that, as mentioned above, two first attachment insertion holes 54a are provided in the first attachment portion 51. In a state where the first insertion-pin insertion hole 33a is arranged between the two first attachment insertion holes 54a, the first insertion pin 5a is inserted into these three holes in the horizontal direction. Although the details are omitted, when the first connecting portion 13 is removed from the first attachment portion 51, the first insertion pin 5a is pulled out of the first attachment insertion holes 54a and the first insertion-pin insertion hole 33a, and thereafter, the first connecting portion 13 is moved relative to the first attachment portion 51 so that the first fixing pins 53a are removed from the first fixing-pin insertion holes 32a. Of course, in the case where the first connecting portion 13 is fastened to the first attachment portion 51 by means of a fastening bolt, operations to fasten and unfasten this fastening bolt are performed when the first connecting portion 13 is attached to and removed from the first attachment portion 51.

Figure 12:
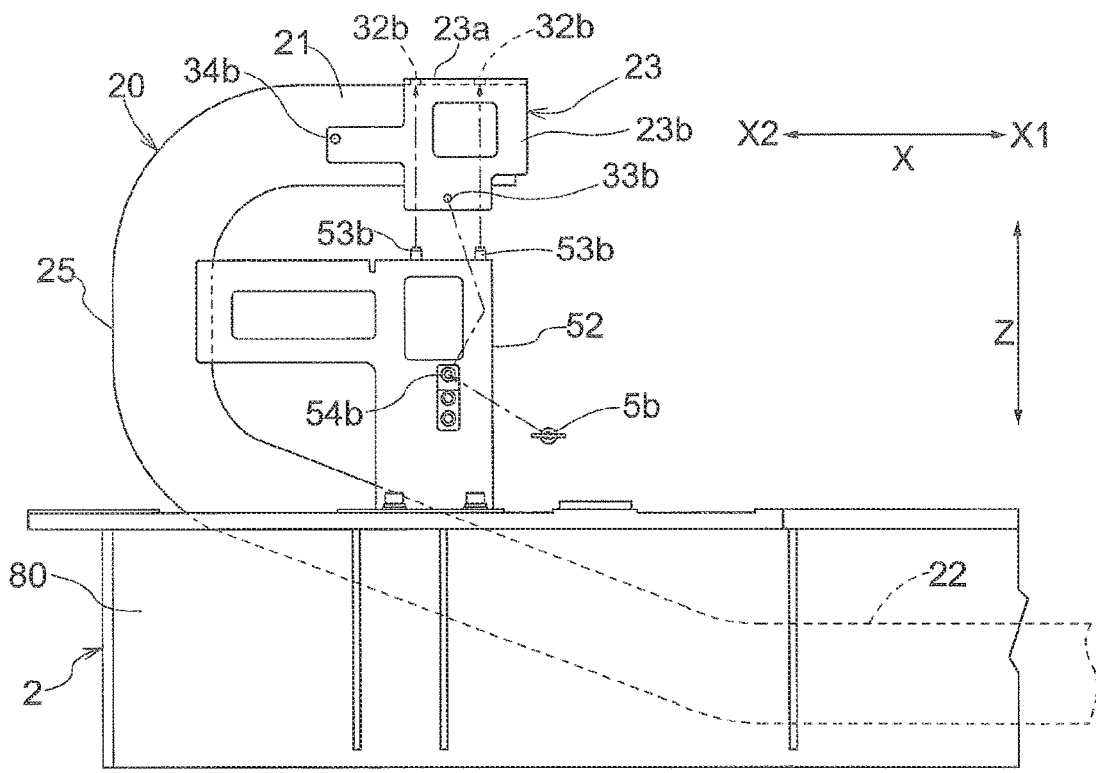
FIG. 12 is a side view showing a structure in which a second connecting portion is attached to a second attachment portion.

As is clear from a comparison between FIGS. 7 and 12, the first attachment portion 51 and the second attachment portion 52 are formed in a mirror-symmetrical manner with a plane perpendicular to the first direction X serving as a symmetry plane. The first connecting portion 13 and the second connecting portion 23 are also formed in a mirror-symmetrical manner with a plane perpendicular to the first direction X acting as a symmetry plane. That is to say, the second attachment portion 52 has a configuration achieved by inverting the first attachment portion 51 in the first direction X. The second connecting portion 23 has a configuration achieved by inverting the first connecting portion 13 in the first direction X. Accordingly, although a detailed description is omitted, the second attachment portion 52 includes second fixing pins 53b, which correspond to the first fixing pins 53a, and second attachment insertion holes 54b, which correspond to the first attachment insertion holes 54a. The second connecting portion 23 includes a third portion 23a, which corresponds to the first portion 13a, a fourth portion 23b, which corresponds to the second portion 13b, second fixing-pin insertion holes 32b, which correspond to the first fixing-pin insertion holes 32a, a second insertion-pin insertion hole 33b, which corresponds to the first insertion-pin insertion hole 33a, and a second holding insertion hole 34b, which corresponds to the first holding insertion hole 34a. When the second connecting portion 23 is attached to the second attachment portion 52, the second fixing pins 53b are inserted into the respective second fixing-pin insertion holes 32b, and thereafter, the second insertion pin 5b is inserted into the second attachment insertion holes 54b and the second insertion-pin insertion hole 33b. The first insertion pin 5a and the second insertion pin 5b may be ball lock pins, for example.

When the first connecting portion 13 is removed from the first attachment portion 51, the first insertion pin 5a is pulled out of the first attachment insertion holes 54a and the first insertion-pin insertion hole 33a. When the second attachment portion 23 is removed from the second connecting portion 52, the second insertion pin 5b is pulled out of the second attachment insertion holes 54b and the second insertion-pin insertion hole 33b. This embodiment employs a configuration in which the first insertion pin 5a is also used for causing the first holder 61 to hold the first connecting portion 13, and the second insertion pin 5b is also used for causing the second holder 62 to hold the second connecting portion 23.

Figure 9:
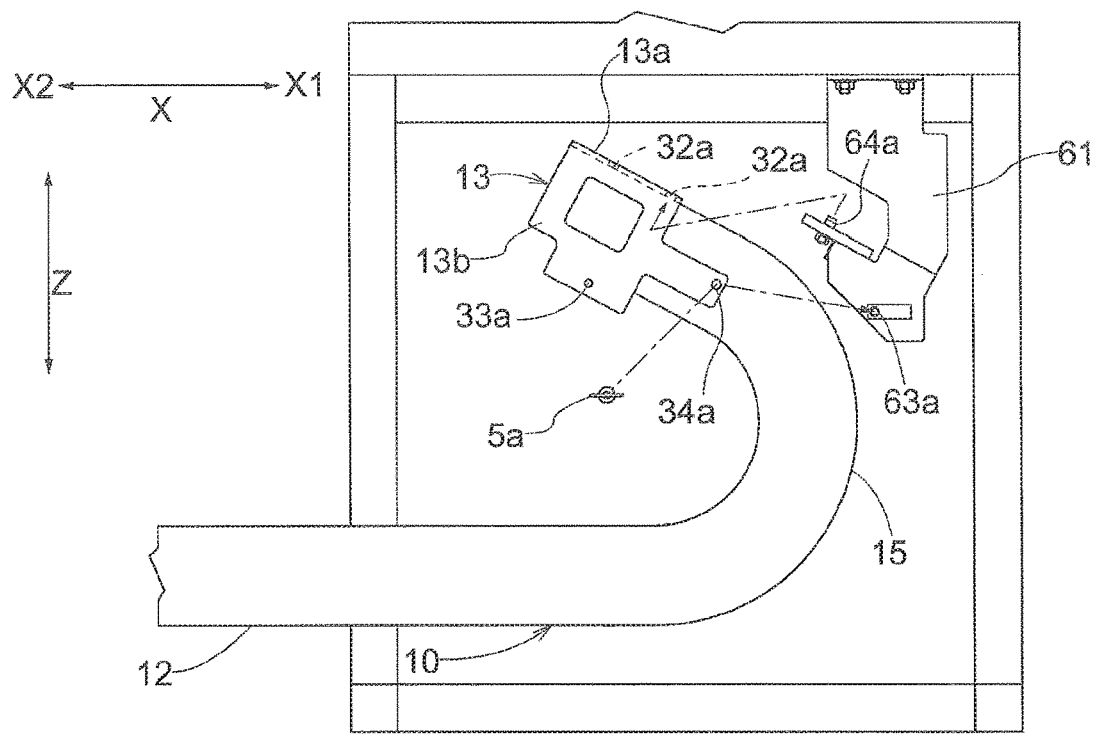
FIG. 9 is a side view showing a structure in which the first connecting portion is attached to a first holder.
Figure 10:
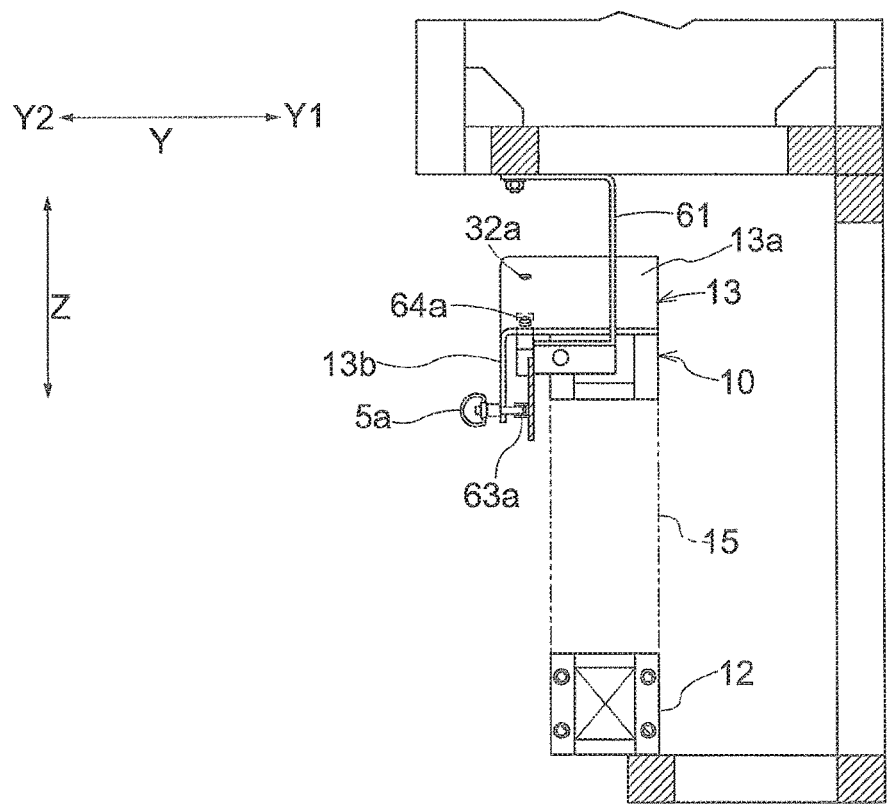
FIG. 10 is a front elevational view showing the first connecting portion in a state of being held by the first holder.

Specifically, as shown in FIGS. 9 and 10, the first holder 61 includes a first insertion hole 63a, into/from which the first insertion pin 5a can be inserted and removed. The first holder 61 is configured to hold the first connecting portion 13, with the first insertion pin 5a inserted into both the first holding insertion hole 34a provided in the first connecting portion 13 and the first insertion holes 63a. In this embodiment, the first holder 61 includes a first holding pin 64a, which can be inserted into and removed from one of the first fixing-pin insertion holes 32a. When the first holder 61 holds the first connecting portion 13, the first insertion pin 5a is inserted into both the first holding insertion hole 34a and the first insertion hole 63a in the horizontal direction, in a state where the first connecting portion 13 is arranged relative to the first holder 61 so that the first holding pin 64a is inserted into one of the first fixing-pin insertion holes 32a. In this embodiment, two first fixing-pin insertion holes 32a are formed in the first connecting portion 13, whereas one first holding pin 64a is provided in the first holder 61. The first holding pin 64a is inserted into either one of the first fixing-pin insertion holes 32a (in this embodiment, the first fixing-pin insertion hole 32a arranged on the first side X1). A configuration may also be employed in which the same number of first holding pins 64a as the number of fixing-pin insertion holes 32a is provided. In this embodiment, the first holding pin 64a is formed so as to protrude upward from an upward face of the first holder 61 that tilts further upward toward the second side X2. Accordingly, in a state where the first connecting portion 13 is held by the first holder 61, the direction in which the first cable body 10 extends at the first connecting portion 13 is a direction moving further upward toward the second side X2 (a direction tilting upward relative to a horizontal plane). Although the details are omitted, when the first connecting portion 13 is removed from the first holder 61, the first insertion pin 5a is pulled out of the first holding insertion hole 34a and the first insertion hole 63a, and thereafter, the first connecting portion 13 is moved relative to the first holder 61 so that the first holding pin 64a is removed from the first fixing-pin insertion hole 32a.

Figure 13:
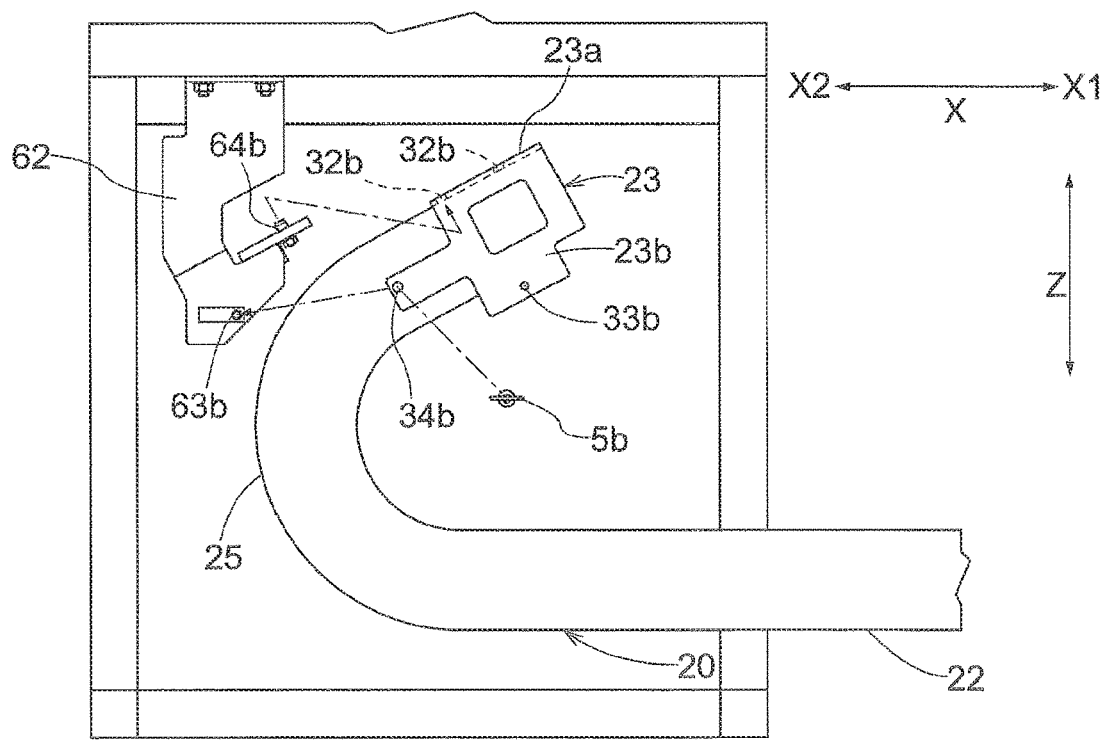
FIG. 13 is a side view showing a structure in which a second connecting portion is attached to a second holder.

As shown in FIG. 13, the second holder 62 includes a second insertion hole 63b, into/from which the second insertion pin 5b can be inserted and removed. The second holder 62 is configured to hold the second connecting portion 23 with the second insertion pin 5b inserted into both the second holding insertion hole 34b provided in the second connecting portion 23 and the second insertion holes 63b. In this embodiment, the second holder 62 includes a second holding pin 64b, which can be inserted into and removed from one of the second fixing-pin insertion holes 32b. When the second holder 62 holds the second connecting portion 23, the second insertion pin 5b is inserted into both the second holding insertion hole 34b and the second insertion hole 63b in the horizontal direction, in a state where the second connecting portion 23 is arranged relative to the second holder 62 so that the second holding pin 64b is inserted into one of the second fixing-pin insertion holes 32b. In this embodiment, two second fixing-pin insertion holes 32b are formed in the second connecting portion 23, whereas one second holding pin 64b is provided in the second holder 62. The second holding pin 64b is inserted into either one of the second fixing-pin insertion holes 32b (in this embodiment, the second fixing-pin insertion hole 32b arranged on the second side X2). A configuration may also be employed in which the same number of second holding pins 64b as the number of fixing-pin insertion holes 32b is provided. In this embodiment, the second holding pin 64b is formed so as to protrude upward from an upward face of the second holder 62 that tilts further upward toward the first side X1. Accordingly, in a state where the second connecting portion 23 is held by the second holder 62, the direction in which the second cable body 20 extends at the second connecting portion 23 is a direction moving further upward toward the first side X1 (a direction tilting upward relative to a horizontal plane). Although the details are omitted, when the second connecting portion 23 is removed from the second holder 62, the second insertion pin 5b is pulled out of the second holding insertion hole 34b and the second insertion hole 63b, and thereafter, the second connecting portion 23 is moved relative to the second holder 62 so that the second holding pin 64b is separated from the second fixing-pin insertion hole 32b.

As described above, the first fixing pins 53a are pins for positioning the first connecting portion 13 relative to the first attachment portion 51, and are configured to be able to be inserted into and removed from the first fixing-pin insertion holes 32a. The article transport facility 9 also includes the first insertion pin 5a for positioning the first connecting portion 13 relative to the first attachment portion 51. The first insertion pin 5a is configured to be able to be inserted into and removed from the first attachment insertion holes 54a, the first insertion-pin insertion hole 33a, and the first holding insertion hole 34a. That is to say, the first insertion pin 5a is a pin capable of being inserted into and removed from the insertion holes provided in the first attachment portion 51 and the first connecting portion 13 (the first insertion-pin insertion hole 33a, the first holding insertion hole 34a, and the first attachment insertion holes 54a). In this embodiment, the first fixing pins 53a and the first insertion pin 5a each correspond to a "first pin". The first attachment insertion holes 54a, the first fixing-pin insertion holes 32a, the first insertion-pin insertion hole 33a, and the first holding insertion hole 34a each correspond to an "insertion hole".

The second fixing pins 53b are pins for positioning the second connecting portion 23 relative to the second attachment portion 52, and are configured to be able to be inserted into and removed from the second fixing-pin insertion holes 32b. The article transport facility 9 also includes the second insertion pin 5b for positioning the second connecting portion 23 relative to the second attachment portion 52. The second insertion pin 5b is configured to be able to be inserted into and removed from the second attachment insertion holes 54b, the second insertion-pin insertion hole 33b, and the second holding insertion hole 34b. That is to say, the second insertion pin 5b is a pin capable of being inserted into and removed from the insertion holes provided in the second attachment portion 52 and the second connecting portion 23 (the second insertion-pin insertion hole 33b, the second holding insertion hole 34b, and the second attachment insertion holes 54b). In this embodiment, the second fixing pins 53b and the second insertion pin 5b each correspond to a "second pin". The second attachment insertion holes 54b, the second fixing-pin insertion holes 32b, the second insertion-pin insertion hole 33b, and the second holding insertion hole 34b each correspond to an "insertion hole".

As shown in FIG. 15, the article transport facility 9 includes the control apparatus 8 for controlling operations of the first transport apparatus 1 and the second transport apparatus 2. The control apparatus 8 includes a processor such as a microprocessor, and a peripheral circuit such as a memory. Functions of the control apparatus 8 are realized through cooperation between the aforementioned hardware and programs executed on the hardware such as the processor. The first transport apparatus 1 and the second transport apparatus 2 each include a traveling drive unit (electric motor etc.) for causing the traveling truck 80 to travel, a lift drive unit (electric motor etc.) for lifting and lowering the lift body 82 to travel, and a transfer drive unit (electric motor etc.) for operating the transfer apparatus 83. The control apparatus 8 controls operations of the first transport apparatus 1 by controlling the driving of the driving units provided in the first transport apparatus 1, and controls operations of the second transport apparatus 2 by controlling the driving of the driving units provided in the second transport apparatus 2. In this embodiment, power for driving the drive units in the first transport apparatus 1 is supplied by the first cable body 10. Power for driving the drive units in the second transport apparatus 2 is supplied by the second cable body 20.

The control apparatus 8 performs first transport control, second transport control, and third transport control. The first transport control is control for causing both the first transport apparatus 1 and the second transport apparatus 2 to transport the articles W, in a state where the movement area of the first transport apparatus 1 is restricted to be within the third movement area R3, and the movement area of the second transport apparatus 2 is restricted to be within the fourth movement area R4, as shown in the upper diagram in FIG. 3. In this embodiment, the third door 73 is switched to a closed state when the first transport control is performed. Also, when the first transport control is performed, the positions of all second support portions 42 are switched to the second withdrawal position 42b, and the positions of all third support portions 43 are switched to the third withdrawal position 43b. Accordingly, the control apparatus 8 does not perform the first transport control if it is determined, based on the detection information from the first sensor 91, that any of the second support portions 42 is present at the second support position 42a, or it is determined, based on the detection information from the second sensor 92, that any of the third support portions 43 is present at the third support position 43a.

The second transport control is control for causing the first transport apparatus 1 to transport the articles W, in a state of allowing the first transport apparatus 1 to move throughout the entire first movement area R1 with only the first transport apparatus 1, of the first transport apparatus 1 and the second transport apparatus 2, being present in the first movement area R1, as shown in the center diagram in the up-down direction in FIG. 3. In other words, the second transport control is control for causing the first transport apparatus 1 to transport the articles W, in a state of allowing the first transport apparatus 1 to move throughout the entire first movement area R1 with the second transport apparatus 2 positioned in the second withdrawal area A2. When the second transport control is performed, the third door 73 is switched to an open state. Also, when the second transport control is performed, the positions of all second support portions 42 are switched to the second support position 42a, and the positions of all third support portions 43 are switched to the third withdrawal position 43b. Accordingly, the control apparatus 8 does not perform the second transport control if it is determined, based on the detection information from the third sensor 93, that any of the second support portions 42 are present at the second withdrawal position 42b, or it is determined, based on the detection information from the second sensor 92, that any of the third support portions 43 are present at the third support position 43a.

Figure 14:
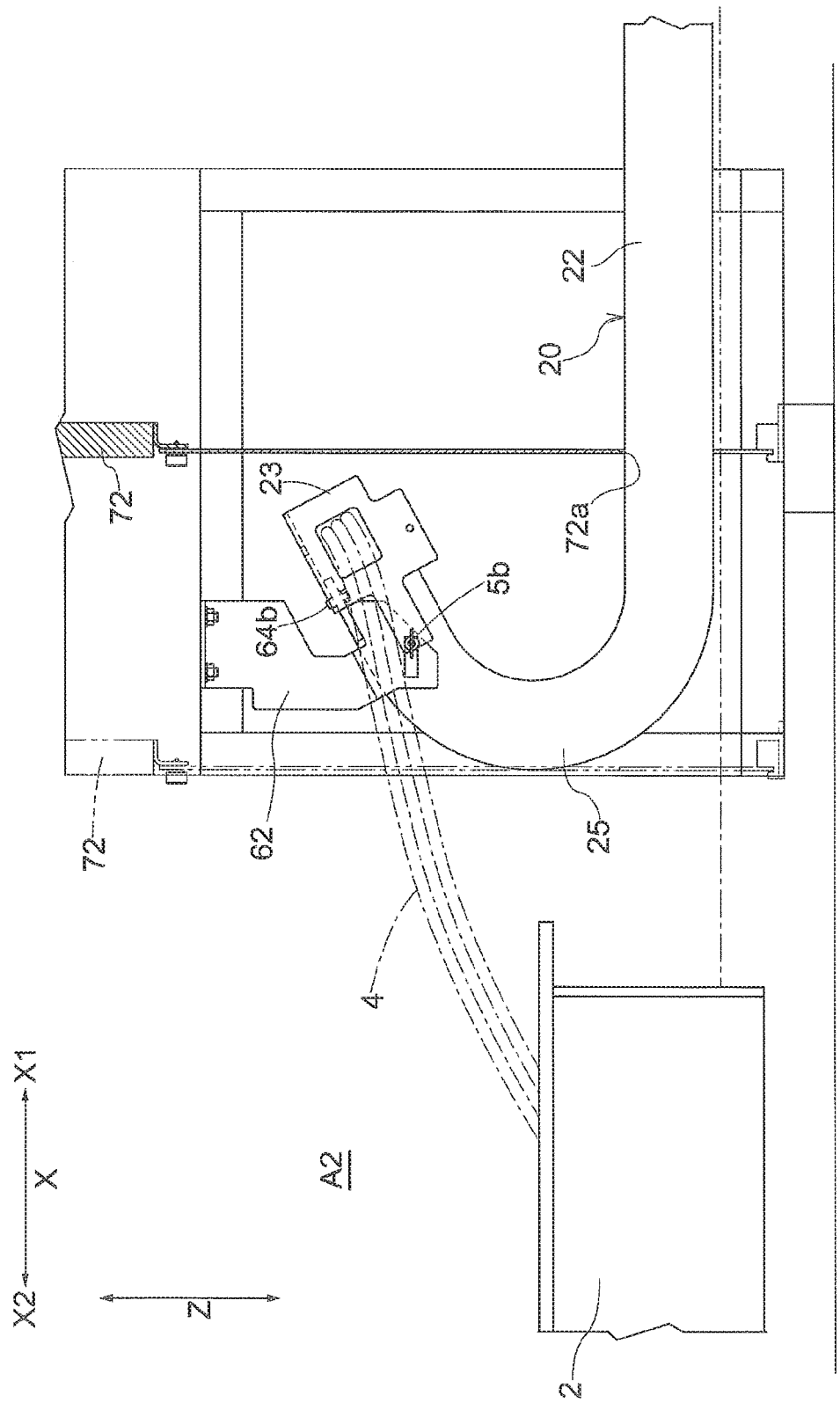
FIG. 14 is a partial side view of the article transport facility during a maintenance operation on the second transport apparatus.

When the second transport control is performed, the second transport apparatus 2 is positioned in the second withdrawal area A2, with the second connecting portion 23 having been removed from the second transport apparatus 2 (second attachment portion 52) and held by the second holder 62, as shown in FIG. 14. In this embodiment, the article transport facility 9 includes a fourth cable body 4, which connects the second transport apparatus 2 positioned in the second withdrawal area A2 to the second connecting portion 23 in a state of being held by the second holder 62. With this configuration, when a maintenance operation on the second transport apparatus 2 is performed, power can be supplied to the second transport apparatus 2, and the control apparatus 8 and the second transport apparatus 2 can communicate with each other, by effectively using the second cable body 20. In this embodiment, the fourth cable body 4 connects ends (connectors, terminals etc.) of the second cable main bodies 26 that extend from the second connecting portion 23 to attachment portions (connectors, terminal bases etc.) provided in the second transport apparatus 2.

The third transport control is control for causing the second transport apparatus 2 to transport the articles W, in a state of allowing the second transport apparatus 2 to move throughout the entire second movement area R2 with only the second transport apparatus 2, of the first transport apparatus 1 and the second transport apparatus 2, being present in the second movement area R2, as shown in the lower diagram in FIG. 3. In other words, the third transport control is control for causing the second transport apparatus 2 to transport the articles W, in a state of allowing the second transport apparatus 2 to move throughout the entire second movement area R2, with the first transport apparatus 1 positioned in the first withdrawal area A1. When the third transport control is performed, the third door 73 is switched to an open state. Also, when the third transport control is performed, the positions of all second support portions 42 are switched to the second withdrawal position 42b, and the positions of all third support portions 43 are switched to the third support position 43a. Accordingly, the control apparatus 8 does not perform the third transport control if it is determined, based on the detection information from the first sensor 91, that any of the second support portions 42 is present at the second support position 42a, or it is determined, based on the detection information from the fourth sensor 94, that any of the third support portions 43 is present at the third withdrawal position 43b.

Figure 11:
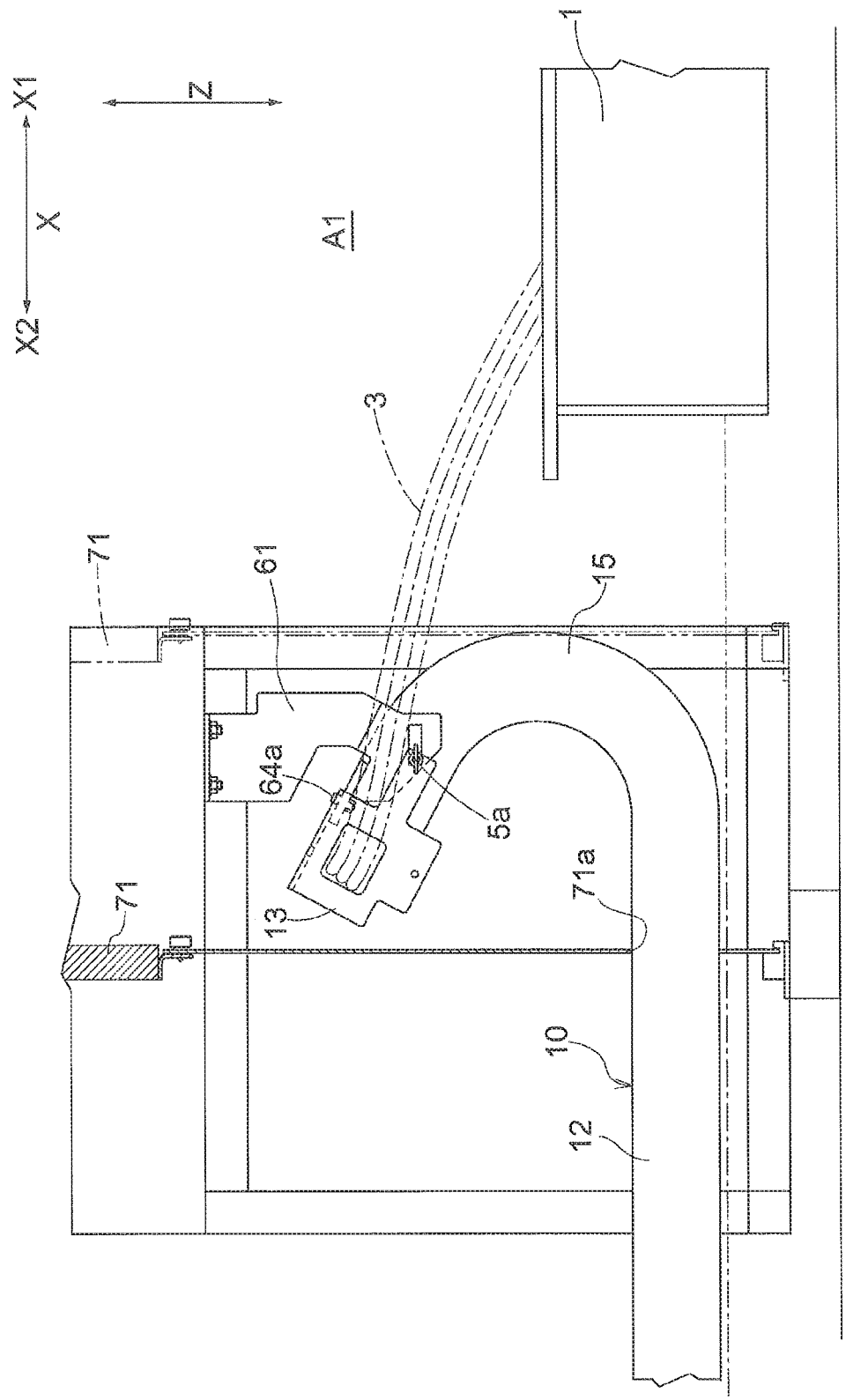
FIG. 11 is a partial side view of the article transport facility during a maintenance operation on the first transport apparatus.

When the third transport control is performed, the first transport apparatus 1 is positioned in the first withdrawal area A1, with the first connecting portion 13 having been removed from the first transport apparatus 1 (first attachment portion 51) and held by the first holder 61, as shown in FIG. 11. In this embodiment, the article transport facility 9 includes a third cable body 3, which connects the first transport apparatus 1 positioned in the first withdrawal area A1 to the first connecting portion 13 in a state of being held by the first holder 61. With this configuration, when a maintenance operation on the first transport apparatus 1 is performed, power can be supplied to the first transport apparatus 1, and the control apparatus 8 and the first transport apparatus 1 can communicate with each other, by effectively using the first cable body 10. In this embodiment, the third cable body 3 connects ends (connectors, terminals etc.) of the first cable main bodies 16 that extend from the first connecting portion 13 to attachment portions (connectors, terminal bases etc.) provided in the first transport apparatus 1.

As mentioned above, in this embodiment, the position at which the first transport apparatus 1 stops when transferring an article W to a corresponding storage section 6a is on the first side X1 relative to the position at which the second transport apparatus 2 stops when transferring an article W to the same storage section 6a or a storage section 6a arranged at the same position in the first direction X as this storage section 6a. For this reason, interference between the second door 72 and the first transport apparatus 1 does not occur even if the position of the second door 72 is moved further toward the first side X1 than the position thereof at the time of performing the first transport control (the position indicated by solid lines in FIG. 1; the position indicated by dash-double dot lines in FIG. 14) within an area that does not overlap the first movement area R1 when the second transport control is performed, as shown in FIG. 14. In view of this point, in this embodiment, the second door 72 is configured to be able to move in the first direction X. The second door 72 is configured to be moved, when the second transport control is performed, toward the first side X1 up to the position at which the second connecting portion 23 in a state of being held by the second holder 62 is arranged on the second side X2 relative to the second door 72 (the position indicated by dash-dot lines in FIG. 1; the position indicated by solid lines in FIG. 14). In addition, the second door 72 has an opening 72a for allowing passage of the second cable body 20 when the second door 72 is in a closed state. Thus, it is possible to arrange, outside the transport area 84, the second connecting portion 23 in a state of being held by the second holder 62, while suppressing air flow between the transport area 84 and the second withdrawal area A2. As a result, it is possible to increase the operability during operations to connect the fourth cable body 4 to the second connecting portion 23 and remove the fourth cable body 4 therefrom. Note that the aforementioned opening 72a is configured to be able to be closed when the second cable body 20 is not passed through this opening 72a.

Also, in this embodiment, the first door 71 is configured to be able to move in the first direction X. The first door 71 is configured to be moved, when the third transport control is performed, toward the second side X2 up to the position at which the first connecting portion 13 in a state of being held by the first holder 61 is arranged on the first side X1 relative to the first door 71 (the position indicated by dash-dot lines in FIG. 1; the position indicated by solid lines in FIG. 11). In addition, the first door 71 has an opening 71a for allowing passage of the first cable body 10 when the first door 71 is in a closed state. Thus, it is possible to arrange the first connecting portion 13 in a state of being held by the first holder 61 outside the transport area 84, while suppressing air flow between the transport area 84 and the first withdrawal area A1. As a result, it is possible to increase the operability during operations to connect the third cable body 3 to the first connecting portion 13 and remove the third cable body 3 therefrom. Note that the aforementioned opening 71a is configured to be able to be closed when the first cable body 10 is not passed through this opening 71a.

Other Embodiments

Other embodiments of the article transport facility will now be described.

Note that configurations disclosed in the following embodiments may be applied while being combined with configurations disclosed in other embodiments, provided there is no inconsistency.

(1) The above embodiment has been described while taking, as an example, a configuration in which the article transport facility 9 includes one first support portion 41. However, the present invention is not limited to this configuration. A configuration may also be employed in which the article transport facility 9 has a first support portion 41 at each of a plurality of third positions P3, which are set between the first positions P1 and the second positions P2. A configuration is also possible in which the article transport facility 9 includes no first support portion 41.

(2) The above embodiment has been described while taking, as an example, a configuration in which the article transport facility 9 includes a plurality of second support portions 42 and a plurality of third support portions 43. However, the present invention is not limited to this configuration. A configuration in which the number of second support portions 42 provided in the article transport facility 9 is one, or a configuration in which the article transport facility 9 includes no second support portion 42 may also be employed. Also, a configuration in which the number of third support portions 43 provided in the article transport facility 9 is one, or a configuration in which the article transport facility 9 includes no third support portion 43 may also be employed.

(3) The above embodiment has been described while taking, as an example, a configuration in which the position of each second support portion 42 is switched between the second support position 42a and the second withdrawal position 42b by switching the orientation of the second support position 42, and the position of each third support portion 43 is switched between the third support position 43a and the third withdrawal position 43b by switching the orientation of the third support position 43. However, the present invention is not limited to this configuration. A configuration may also be employed in which the position of each second support portion 42 is switched between the second support position 42a and the second withdrawal position 42b by switching the position at which the second support portion 42 is installed. A configuration may also be employed in which the position of each second support portion 42 is switched between the second support position 42a and the second withdrawal position 42b by switching both the orientation of the second support portion 42 and the position at which the second support portion 42 is installed. Also, a configuration may also be employed in which the position of each third support portion 43 is switched between the third support position 43a and the third withdrawal position 43b by switching the position at which the third support portion 43 is installed. A configuration may also be employed in which the position of each third support portion 43 is switched between the third support position 43a and the third withdrawal position 43b by switching both the orientation of the third support portion 43 and the position at which the third support portion 43 is installed.

(4) The above embodiment has been described while taking, as an example, a configuration in which the article transport facility 9 includes a first sensor 91 for projecting a detection light beam in the first direction X and detecting that at least one of the second support portions 42 is positioned at the second support position 42a, a second sensor 92 for projecting a detection light beam in the first direction X and detecting that at least one of the third support portions 43 is positioned at the third support position 43a, a third sensor 93 for projecting a detection light beam in the first direction X and detecting that at least one of the second support portions 42 is positioned at the second withdrawal position 42b, and a fourth sensor 94 for projecting a detection light beam in the first direction X and detecting that at least one of the third support portions 43 is positioned at the third withdrawal position 43b. However, the present invention is not limited to this configuration. A configuration may also be employed in which the article transport facility 9 only includes at least one of the first sensor 91, the second sensor 92, the third sensor 93, and the fourth sensor 94 (e.g. only the first sensor 91 and the second sensor 92). A configuration may also be employed in which the article transport facility 9 includes sensors for detecting positions individually for the respective second support portions 42, and a configuration may also be employed in which the article transport facility 9 includes sensors for detecting positions individually for the respective third support portions 43.

(5) The above embodiment has been described while taking, as an example, a configuration in which the first holding insertion hole 34a is provided separately from the first insertion-pin insertion hole 33a, and the first holder 61 holds the first connecting portion 13, with the first insertion pin 5a inserted into both the first holding insertion hole 34a and the first insertion hole 63a. However, the present invention is not limited to this configuration. A configuration may also be employed in which the first holder 61 holds the first connecting portion 13, with the first insertion pin 5a inserted into both the first holding insertion hole 33a and the first insertion hole 63a. Also, the above embodiment has been described while taking, as an example, a configuration in which the second holding insertion hole 34b is provided separately from the second insertion-pin insertion hole 33b, and the second holder 62 holds the second connecting portion 23, with the second insertion pin 5b inserted into both the second holding insertion hole 34b and the second insertion holes 63b. However, the present invention is not limited to this configuration. A configuration may also be employed in which the second holder 62 holds the second connecting portion 23, with the second insertion pin 5b inserted into both the second insertion-pin insertion hole 33b and the second insertion hole 63b.

(6) The above embodiment has been described while taking, as an example, a configuration in which the first insertion pin 5a is also used for causing the first holder 61 to hold the first connecting portion 13, and the second insertion pin 5b is also used for causing the second holder 62 to hold the second connecting portion 23. However, the present invention is not limited to this configuration. A configuration may also be employed in which the first insertion pin 5a is not used for causing the first holder 61 to hold the first connecting portion 13. A configuration may also be employed in which the second insertion pin 5b is not used for causing the second holder 62 to hold the second connecting portion 23. The structure with which the first holder 61 holds the first connecting portion 13 may be modified as appropriate. For example, a configuration may be employed in which the first holder 61 holds the first connecting portion 13 by means of fastening using a fastening bolt. The structure with which the second holder 62 holds the second connecting portion 23 may also be modified as appropriate. For example, a configuration may be employed in which the second holder 62 holds the second connecting portion 23 by means of fastening using a fastening bolt.

(7) The above embodiment has been described while taking, as an example, a configuration in which the first connecting portion 13 is positioned relative to the first attachment portion 51 in all directions by fitting pins to insertion holes, as in the case of fitting the first fixing pins 53a to the first fixing-pin insertion holes 32a, and fitting the first insertion pin 5a to the first attachment insertion holes 54a and the first insertion-pin insertion hole 33a. Also, the above embodiment has been described while taking, as an example, a configuration in which the second connecting portion 23 is positioned relative to the second attachment portion 52 in all directions by fitting pins to insertion holes, as in the case of fitting the second fixing pins 53b to the second fixing-pin insertion holes 32b, and fitting the second insertion pin 5b to the second attachment insertion hole 54b and the second insertion-pin insertion hole 33b. However, the present invention is not limited to this configuration. A configuration may also be employed in which the positioning in at least some directions is not performed by fitting pins to insertion holes. For example, at least some of the fitting portions formed by the pins and insertion holes in the above embodiment may be fastening portions using fastening bolts. The configuration of the pins and insertion holes at the fitting portions described in the above embodiment is an example. Modifications may be made as appropriate as to which of the two members to be fitted is to be provided with a pin, and whether the pin to be used is a fixing pin that is to be fixed to either one of the two members to be fitted, or an insertion pin that is not to be fixed to either one of them.

(8) The above embodiment has been described while taking, as an example, a configuration in which the article transport facility 9 includes the third cable body 3 and the fourth cable body 4. However, the present invention is not limited to this configuration. A configuration may also be employed in which the article transport facility 9 does not include the third cable body 3, and power supply or communication using the first cable body 10 is not performed when a maintenance operation on the first transport apparatus 1 is performed. A configuration may also be employed in which the article transport facility 9 does not include the fourth cable body 4, and power supply or communication using the second cable body 20 is not performed when a maintenance operation on the second transport apparatus 2 is performed.

(9) The above embodiment has been described while taking, as an example, a configuration in which the first cable body 10 includes both the first cable main body 16 for power supply and the first cable main body 16 for communication, and the second cable body 20 includes both the second cable main body 26 for power supply and the second cable main body 26 for communication. However, the present invention is not limited to this configuration. For example, a configuration may also be employed in which the first cable body 10 only includes the first cable main body 16 for power supply, and the second cable body 20 only includes the second cable main body 26 for power supply. In this case, for example, communication between the control apparatus 8 and the first transport apparatus 1 and communication between the control apparatus 8 and the second transport apparatus 2 can be wirelessly performed. Also, for example, a configuration may also be employed in which the first cable body 10 only includes the first cable main body 16 for communication, and the second cable body 20 only includes the second cable main body 26 for communication. In this case, for example, a configuration may be employed in which a power supply rail is installed on the floor F along the first direction X, and a collector portion for collecting power from this power supply rail is provided in the first transport apparatus 1 and the second transport apparatus 2.

(10) The above embodiment has been described while taking, as an example, a configuration in which a portion (first upper portion 11) of the first cable body 10 between the first fold-back portion 15 and the first connecting portion 13 is arranged on the upper side of a portion (first lower portion 12) of the first cable body 10 between the first fold-back portion 15 and the first end 14, and a portion (second upper portion 21) of the second cable body 20 between the second fold-back portion 25 and the second connecting portion 23 is arranged on the upper side of a portion (second lower portion 22) of the second cable body 20 between the second fold-back portion 25 and the second end 24. However, the present invention is not limited to this configuration. A configuration may also be employed in which the portion of the first cable body 10 between the first fold-back portion 15 and the first connecting portion 13 is arranged on one side in the second direction Y (e.g. fourth side Y2) of the portion of the first cable body 10 between the first fold-back portion 15 and the first end 14, and the portion of the second cable body 20 between the second fold-back portion 25 and the second connecting portion 23 is arranged on one side in the second direction Y (e.g. fourth side Y2) of the portion of the second cable body 20 between the second fold-back portion 25 and the first end 24. That is to say, a configuration may be employed in which the first cable body 10 and the second cable body 20 bend in a horizontal plane, rather than in a vertical plane, respectively at the first fold-back portion 15 and the second fold-back portion 25.

(11) The above embodiment has been described while taking, as an example, a configuration in which the first withdrawal area A1 is provided on the first side X1 relative to the first movement area R1 and the second movement area R2, and the second withdrawal area A2 is provided on the second side X2 relative to the first movement area R1 and the second movement area R2. However, the present invention is not limited to this configuration. A configuration may also be employed in which the first withdrawal area A1 is provided within the first movement area R1, and the first transport apparatus 1 can be moved to the first withdrawal area A1, with the first connecting portion 13 attached to the first attachment portion 51. In this case, the first holder 61 is not necessary. A configuration may also be employed in which the second withdrawal area A2 is provided within the second movement area R2, and the second transport apparatus 2 can be moved to the second withdrawal area A2, with the second connecting portion 23 attached to the second attachment portion 52. In this case, the second holder 62 is not necessary.

(12) The above embodiment has been described while taking, as an example, a configuration in which each of the articles W is a container for accommodating a substrate, such as a semiconductor substrate. However, the present invention is not limited to this configuration. For example, a configuration may also be employed in which each of the articles W may be a container for accommodating an item other than a substrate, such as an industrial product, food, or a pharmaceutical product. The articles W each may also be an article other than a container.

(13) It is to be understood, regarding any other configurations, that the embodiment disclosed in this specification is merely an example in all aspects. Accordingly, those skilled in the art may make various changes as appropriate, without departing from the gist of this disclosure.

[Overview of the above embodiment] An overview of the above-described article transport facility will be described below.

An article transport facility includes: a storage rack in which a plurality of storage sections for storing articles are arranged in a first direction along a horizontal direction; a rail installed on a floor along the first direction; a first transport apparatus and a second transport apparatus that are guided by the rail to move along the first direction in front of the storage rack and transport the articles to the storage sections or from the storage sections; a first cable body for power supply or communication that is connected to the first transport apparatus and extends in the first direction; and a second cable body for power supply or communication that is connected to the second transport apparatus and extends in the first direction, wherein both a first end, which is an end of the first cable body on a side opposite to a connecting portion thereof connected to the first transport apparatus, and a second end, which is an end of the second cable body on a side opposite to a connecting portion thereof connected to the second transport apparatus, are fixed to the floor, the first cable body allows the first transport apparatus to move in a first movement area, which is an area extending along the first direction, by deforming as the first transport apparatus moves along the first direction, the second cable body allows the second transport apparatus to move in a second movement area, which is an area extending along the first direction and at least partially overlapping the first movement area, by deforming as the second transport apparatus moves along the first direction, and assuming that a direction perpendicular to both the first direction and an up-down direction is a second direction, the first cable body and the second cable body are arranged on the same side in the second direction relative to the rail so that respective areas in which the first cable body and the second cable body are arranged in the second direction at least partially overlap each other.

With this configuration, the two cable bodies, namely the first cable body and the second cable body are arranged on the same side in the second direction relative to the rail so that the respective arrangement areas in the second direction overlap each other at least partially. Accordingly, the respective arrangement spaces of the two cable bodies can be collectively placed in specific areas in the second direction, and a reduction in the size of the facility in the second direction is facilitated compared with the case where the two cable bodies are separately arranged on the respective sides in the second direction relative to the rail. Also, compared with the case where the two cable bodies are separately arranged on the respective sides in the second direction relative to the rail, the restrictions regarding the arrangement of other members that are arranged near the floor similarly to the cable bodies can be relaxed. As a result, it is possible to achieve a reduction in the size of the facility and achieve simplification of the facility with a simple arrangement of the other members.

As described above, with the above configuration, it is possible to realize an article transport facility in which two cable bodies can be arranged while suppressing an increase in the size and complexity of the facility.

Here, it is preferable that the first transport apparatus is arranged on a first side, which is one side in the first direction, relative to the second transport apparatus, assuming that the connecting portion of the first cable body that is connected to the first transport apparatus is a first connecting portion, the first cable body has, on the first side relative to the first end and the first connecting portion, a first fold-back portion that inverts an extending direction in which the first cable body extends from the first end toward the first connecting portion, a first upper portion, which is a portion of the first cable body between the first fold-back portion and the first connecting portion, is arranged on an upper side of a first lower portion, which is a portion of the first cable body between the first fold-back portion and the first end, assuming that the connecting portion of the second cable body that is connected to the second transport apparatus is a second connecting portion, the second cable body has, on a second side opposite to the first side relative to the second end and the second connecting portion, a second fold-back portion that inverts an extending direction in which the second cable body extends from the second end toward the second connecting portion, a second upper portion, which is a portion of the second cable body between the second fold-back portion and the second connecting portion, is arranged on an upper side of a second lower portion, which is a portion of the second cable body between the second fold-back portion and the second end, and assuming that a position of the first fold-back portion in the first direction when the first transport apparatus is positioned at an end of the first movement area on the second side is a first position, and also assuming that a position of the second fold-back portion in the first direction when the second transport apparatus is positioned at an end of the second movement area on the first side is a second position, a first support portion is provided at a third position, which is a position between the first position and the second position, the first support portion being for supporting the first upper portion from below when the first transport apparatus is positioned on the second side relative to the third position, and for supporting the second upper portion from below when the second transport apparatus is positioned on the first side relative to the third position.

With this configuration, when the first transport apparatus is positioned on the second side relative to the third position, the first upper portion can be supported from below by the first support portion provided at the third position. Accordingly, when the first transport apparatus is positioned on the second side relative to the third position, the length of the first upper portion along the extending direction (the distance between the first fold-back portion and the first connecting portion) increases, and an intermediate portion of the first upper portion in the extending direction is more likely to sag under its own weight. However, the first upper portion can be restrained from sagging by supporting the first upper portion from below using the first support portion. As a result, it is possible for the first upper portion to avoid coming into contact with the floor or other members (e.g. the second lower portion) arranged on the floor.

In addition, with the above configuration, when the second transport apparatus is positioned on the first side relative to the third position, the second upper portion can be supported from below by the first support portion provided at the third position. Accordingly, when the second transport apparatus is positioned on the first side relative to the third position, the length of the second upper portion along the extending direction (the distance between the second fold-back portion and the second connecting portion) increases, and an intermediate portion of the second upper portion in the extending direction is more likely to sag under its own weight. However, the second upper portion can be restrained from sagging by supporting the second upper portion from below using the first support portion. As a result, it is possible for the second upper portion to avoid coming into contact with the floor or other members (e.g. the first lower portion) arranged on the floor.

As described above, with the above configuration, it is possible for both the first upper portion and the second upper portion to avoid coming into contact with the floor or other members arranged on the floor. Accordingly, damage on the cable bodies and degradation of the cable bodies can be suppressed, and dust deriving from friction can also be suppressed.

Note that, since the first support portion is provided at a position between the first position and the second position, the first support portion is positioned outside the space where the first fold-back portion moves when the first transport apparatus moves in the first movement area, and is positioned outside the space where the second fold-back portion moves when the second transport apparatus moves in the second movement area. Accordingly, there is also an advantage in that the first support portion may be a simple one whose orientation and installation position are fixed.

It is preferable that the first transport apparatus is arranged on a first side, which is one side in the first direction, relative to the second transport apparatus, assuming that the connecting portion of the first cable body that is connected to the first transport apparatus is a first connecting portion, the first cable body has, on the first side relative to the first end and the first connecting portion, a first fold-back portion that inverts an extending direction in which the first cable body extends from the first end toward the first connecting portion, a first upper portion, which is a portion of the first cable body between the first fold-back portion and the first connecting portion, is arranged on an upper side of a first lower portion, which is a portion of the first cable body between the first fold-back portion and the first end, assuming that the connecting portion of the second cable body that is connected to the second transport apparatus is a second connecting portion, the second cable body has, on a second side opposite to the first side relative to the second end and the second connecting portion, a second fold-back portion that inverts an extending direction in which the second cable body extends from the second end toward the second connecting portion, a second upper portion, which is a portion of the second cable body between the second fold-back portion and the second connecting portion, is arranged on an upper side of a second lower portion, which is a portion of the second cable body between the second fold-back portion and the second end, and assuming that a position of the first fold-back portion in the first direction when the first transport apparatus is positioned at an end of the first movement area on the second side is a first position, and also assuming that a position of the second fold-back portion in the first direction when the second transport apparatus is positioned at an end of the second movement area on the first side is a second position, a second support portion and a third support portion are provided, the second support portion being for supporting the first upper portion from below on an upper side of the second lower portion when the first transport apparatus is positioned on the second side relative to the second position, the third support portion being for supporting the second upper portion from below on an upper side of the first lower portion when the second transport apparatus is positioned on the first side relative to the first position, the second support portion is configured so that at least one of an orientation and an installation position thereof can be switched between a second support position and a second withdrawal position, the second support position being a position at which the second support portion supports the first upper portion from below, the position being within a second movement space, which is a space in which the second fold-back portion moves when the second transport apparatus moves in the second movement area, and the second withdrawal position being outside the second movement space, and the third support portion is configured so that at least one of an orientation and an installation position thereof can be switched between a third support position and a third withdrawal position, the third support position being a position at which the third support portion supports the second upper portion from below, the position being within a first movement space, which is a space in which the first fold-back portion moves when the first transport apparatus moves in the first movement area, and the third withdrawal position being outside the first movement space.

The first cable body and the second cable body are arranged so that the respective arrangement areas in the second direction overlap each other at least partially. Accordingly, when the first transport apparatus is positioned on the second side relative to the second position, there may be a situation where the first upper portion is arranged above the second lower portion and overlaps the second lower portion as viewed in the up-down direction (hereinafter referred to as a "first situation"). When the second transport apparatus is positioned on the first side relative to the first position, there may be a situation where the second upper portion is arranged above the first lower portion and overlaps the first lower portion as viewed in the up-down direction (hereinafter referred to as a "second situation").

In this regard, with the above configuration, the second support portion is provided, and this second support portion supports the first upper portion from below on the upper side of the second lower portion when the first transport apparatus is positioned on the second side relative to the second position. Accordingly, in the aforementioned first situation, the height of the first upper portion at the position at which the second support portion is installed can be kept at a height higher than the second lower portion. As a result, the first upper portion can be restrained from sagging, and contact between the first upper portion and the second lower portion can be avoided. In addition, with the above configuration, the third support portion is provided, and this third support portion supports the second upper portion from below on the upper side of the first lower portion when the second transport apparatus is positioned on the first side relative to the first position. Accordingly, in the aforementioned second situation, the height of the second upper portion at the position at which the third support portion is installed can be kept at a height higher than the first lower portion. As a result, the second upper portion can be restrained from sagging, and contact between the second upper portion and the first lower portion can be avoided.

Note that the second support portion is configured to be able to switch its position (at least one of the posture and the installation position; the same will apply to the following description) between the second support position and the second withdrawal position. Accordingly, when the second transport apparatus moves in the second movement area, interference between the second support portion and the second cable body can be avoided by switching the position of the second support portion to the second withdrawal position. The third support portion is configured to be able to switch its position between the third support position and the third withdrawal position. Accordingly, when the first transport apparatus moves in the first movement area, interference between the third support portion and the first cable body can be avoided by switching the position of the third support portion to the third withdrawal position.

It is preferable that the second support portion is provided at a plurality of positions on the second side relative to the second position, and the third support portion is provided at a plurality of positions on the first side relative to the first position, and a first sensor and a second sensor are provided, the first sensor being for projecting a detection light beam in the first direction and detecting that at least one second support portion is positioned at the second support position, and the second sensor being for projecting a detection light beam in the first direction and detecting that at least one third support portion is positioned at the third support position.

With this configuration, it can be determined, based on the detection information from the first sensor, as to whether or not any second support portion is present at the second support position, without providing sensors for detecting positions individually for the respective second support portions. Furthermore, by setting the absence of a second support portion positioned at the second support position as a condition for allowing the second transport apparatus to move in the second movement area, it is possible to avoid moving of the second transport apparatus in the second movement area with at least one of the second support portions positioned at the second support position, and avoid interference between the second support portions and the second cable body.

In addition, with the above configuration, it can be determined, based on the detection information from the second sensor, as to whether or not any third support portion is present at the third support position, without providing sensors for detecting positions individually for the respective third support portions. Furthermore, by setting the absence of a third support portion positioned at the third support position as a condition for allowing the first transport apparatus to move in the first movement area, it is possible to avoid moving of the first transport apparatus in the first movement area with at least one of the third support portions positioned at the third support position, and interference between the third support portions and the first cable body can be avoided.

As described above, with the above configuration, it is possible to avoid interference between the second support portions and the second cable body, and interference between the third support portions and the first cable body, with a simple detection system using a relatively small number of optical sensors.

It is preferable that the second support portion is provided at a plurality of positions on the second side relative to the second position, and the third support portion is provided at a plurality of positions on the first side relative to the first position, and a third sensor and a fourth sensor are provided, the third sensor being for projecting a detection light beam in the first direction and detecting that at least one second support portion is positioned at the second withdrawal position, and the fourth sensor being for projecting a detection light beam in the first direction and detecting that at least one third support portion is positioned at the third withdrawal position.

With this configuration, it can be determined, based on the detection information from the third sensor, as to whether or not any second support portion is present at the second withdrawal position, without providing sensors for detecting positions individually for the respective second support portions. Furthermore, by setting the absence of a second support portion positioned at the second withdrawal position as a condition for allowing the first transport apparatus to move toward the second side relative to the second position, it is possible to avoid moving of the first transport apparatus toward the second side relative to the second position, with any of the second support portions having not been switched to the second support position. If any of the second support portions has not been switched to the second support position when the first transport apparatus is positioned on the second side relative to the second position, the first upper portion cannot be supported at the position at which this second support portion is installed, and there is concern that the first upper portion will sag and come into contact with the second lower portion. However, by avoiding moving of the first transport apparatus toward the second side relative to the second position with any of the second support portions having not been switched to the second support position as described above, contact between the first upper portion and the second lower portion can be avoided.

In addition, with the above configuration, it can be determined, based on the detection information from the fourth sensor, as to whether or not any third support portion is present at the third withdrawal position, without providing sensors for detecting positions individually for the respective third support portions. Furthermore, by setting the absence of a third support portion positioned at the third withdrawal position as a condition for allowing the second transport apparatus to move toward the first side relative to the first position, it is possible to avoid moving of the second transport apparatus toward the first side relative to the first position, with any of the third support portions having not been switched to the third support position. If any of the third support portions has not been switched to the third support position when the second transport apparatus is positioned on the first side relative to the first position, the second upper portion cannot be supported at the position at which that third support portion is installed, and there is concern that the second upper portion will sag and come into contact with the first lower portion. However, by avoiding moving of the second transport apparatus toward the first side relative to the first position with any of the third support portions having not been switched to the third support position as described above, contact between the second upper portion and the first lower portion can be avoided.

As described above, with the above configuration, it is possible to avoid interference between the first upper portion and the second lower portion, and interference between the second upper portion and the first lower portion, with a simple detection system using a relatively small number of optical sensors.

It is preferable that the first cable body and the second cable body each include a cable main body and a cable carrier for accommodating the cable main body and restricting a direction in which the cable main body extends.

With this configuration, regarding both the first cable body and the second cable body, the direction in which the cable main body extends can be restricted by the cable carrier. Accordingly, when the first cable body deforms as the first transport apparatus moves, and when the second cable body deforms as the second transport apparatus moves, it is possible to restrict undefined deformation of the cable main body and cause the cable main body to deform following the deformation of the cable carrier. Accordingly, when the cable body that includes the cable main body deforms as the transport apparatus moves, it is possible to avoid a curved portion having a curvature radius that is smaller than a tolerable curvature radius from being formed in the cable main body. As a result, damage on the cable main bodies and degradation of the cable main bodies can be suppressed.

Furthermore, in the case of providing a support portion for supporting the cable body, such as the aforementioned first support portion, second support portion, and third support portion, the cable body comes into contact with the support portion when being supported by the support portion. However, with the above configuration, the cable main body is accommodated in the cable carrier, and it is accordingly possible to avoid contact between the cable main body and the support portion to protect the cable main body.

It is preferable that the article transport facility further includes a control apparatus for controlling operation of the first transport apparatus and the second transport apparatus, wherein the first transport apparatus is arranged on a first side, which is one side in the first direction, relative to the second transport apparatus, the control apparatus performs first transport control, second transport control, and third transport control, assuming that a position within an area in which the first movement area and the second movement area overlap each other is a reference position, the first transport control is control for causing both the first transport apparatus and the second transport apparatus to transport the articles, in a state where a movement area of the first transport apparatus is restricted to be within an area in the first movement area on the first side relative to the reference position, and in a state where a movement area of the second transport apparatus is restricted be within an area in the second movement area on a second side opposite to the first side relative to the reference position, the second transport control is control for causing the first transport apparatus to transport the articles, in a state of allowing the first transport apparatus to move throughout the entire first movement area with only the first transport apparatus, of the first transport apparatus and the second transport apparatus, being present in the first movement area, and the third transport control is control for causing the second transport apparatus to transport the articles, in a state of allowing the second transport apparatus to move throughout the entire second movement area with only the second transport apparatus, of the first transport apparatus and the second transport apparatus, being present in the second movement area.

With this configuration, since the control apparatus can perform the first transport control, the second transport control, and the third transport control, appropriate transport control can be selected and performed in accordance with the situation. For example, by performing the first transport control, articles can be efficiently transported using both the first transport apparatus and the second transport apparatus. At this time, the movement area of the first transport apparatus and the movement area of the second transport apparatus are set so as not to overlap each other. Accordingly, interference between the first transport apparatus and the second transport apparatus can be readily avoided. For example, when a maintenance operation on the second transport apparatus is performed, articles can be transported by the first transport apparatus while performing the maintenance operation on the second transport apparatus, by performing the second transport control. At this time, the first transport apparatus is allowed to move throughout the entire first movement area, with only the first transport apparatus, of the first transport apparatus and the second transport apparatus, being present in the first movement area. Accordingly, the first transport apparatus can also perform a transport operation for transport to/from a storage section that is present in an area in the first movement area that overlaps the second movement area, while appropriately avoiding interference between the first transport apparatus and the second transport apparatus. For example, when a maintenance operation on the first transport apparatus is performed, articles can be transported by the second transport apparatus while performing the maintenance operation on the first transport apparatus, by performing the third transport control. At this time, the second transport apparatus is allowed to move throughout the entire second movement area, with only the second transport apparatus, of the first transport apparatus and the second transport apparatus, being present in the second movement area. Accordingly, the second transport apparatus can also perform a transport operation for transport to/from a storage section that is present in an area in the second movement area that overlaps the first movement area, while appropriately avoiding interference between the first transport apparatus and the second transport apparatus.

What is claimed is:

1. An article transport facility comprising:
    a storage rack in which a plurality of storage sections for storing articles are arranged in a first direction along a horizontal direction;
    a rail installed on a floor along the first direction;
    a first transport apparatus and a second transport apparatus that are guided by the rail to move in the first direction in front of the storage rack and transport the articles to the storage sections or from the storage sections;
    a first cable body for power supply or communication that is connected to the first transport apparatus and extends in the first direction; and
    a second cable body for power supply or communication that is connected to the second transport apparatus and extends in the first direction,
    wherein:
    both a first end, which is an end of the first cable body on a side opposite to a connecting portion thereof connected to the first transport apparatus, and a second end, which is an end of the second cable body on a side opposite to a connecting portion thereof connected to the second transport apparatus, are fixed to the floor,
    the first cable body allows the first transport apparatus to move in a first movement area, which is an area extending along the first direction, by deforming as the first transport apparatus moves along the first direction,
    the second cable body allows the second transport apparatus to move in a second movement area, which is an area extending along the first direction and at least partially overlapping the first movement area, by deforming as the second transport apparatus moves along the first direction, and
    the first cable body and the second cable body are arranged on the same side in a second direction, which is perpendicular to both the first direction and an up-down direction, relative to the rail so that an area in which the first cable body is arranged and an area in which the second cable body is arranged in the second direction at least partially overlap each other.

2. The article transport facility according to claim 1, wherein:
    the first transport apparatus is arranged on a first side, which is one side in the first direction, relative to the second transport apparatus,
    the connecting portion of the first cable body that is connected to the first transport apparatus is a first connecting portion such that the first cable body has, on the first side relative to the first end and the first connecting portion, a first fold-back portion that inverts an extending direction in which the first cable body extends from the first end toward the first connecting portion,
    a first upper portion, which is a portion of the first cable body between the first fold-back portion and the first connecting portion, is arranged on an upper side of a first lower portion, which is a portion of the first cable body between the first fold-back portion and the first end,
    the connecting portion of the second cable body that is connected to the second transport apparatus is a second connecting portion such that the second cable body has, on a second side opposite to the first side relative to the second end and the second connecting portion, a second fold-back portion that inverts an extending direction in which the second cable body extends from the second end toward the second connecting portion,
    a second upper portion, which is a portion of the second cable body between the second fold-back portion and the second connecting portion, is arranged on an upper side of a second lower portion, which is a portion of the second cable body between the second fold-back portion and the second end, and
    a position of the first fold-back portion in the first direction when the first transport apparatus is positioned at an end of the first movement area on the second side is a first position, a position of the second fold-back portion in the first direction when the second transport apparatus is positioned at an end of the second movement area on the first side is a second position, a first support portion is provided at a third position, which is a position between the first position and the second position, the first support portion being for supporting the first upper portion from below when the first transport apparatus is positioned on the second side relative to the third position, and for supporting the second upper portion from below when the second transport apparatus is positioned on the first side relative to the third position.

3. The article transport facility according to claim 1, wherein:
    the first transport apparatus is arranged on a first side, which is one side in the first direction, relative to the second transport apparatus, the connecting portion of the first cable body that is connected to the first transport apparatus is a first connecting portion such that the first cable body has, on the first side relative to the first end and the first connecting portion, a first fold-back portion that inverts an extending direction in which the first cable body extends from the first end toward the first connecting portion, a first upper portion, which is a portion of the first cable body between the first fold-back portion and the first connecting portion, is arranged on an upper side of a first lower portion, which is a portion of the first cable body between the first fold-back portion and the first end, the connecting portion of the second cable body that is connected to the second transport apparatus is a second connecting portion such that the second cable body has, on a second side opposite to the first side relative to the second end and the second connecting portion, a second fold-back portion that inverts an extending direction in which the second cable body extends from the second end toward the second connecting portion, a second upper portion, which is a portion of the second cable body between the second fold-back portion and the second connecting portion, is arranged on an upper side of a second lower portion, which is a portion of the second cable body between the second fold-back portion and the second end, and a position of the first fold-back portion in the first direction when the first transport apparatus is positioned at an end of the first movement area on the second side is a first position, and a position of the second fold-back portion in the first direction when the second transport apparatus is positioned at an end of the second movement area on the first side is a second position, a second support portion and a third support portion are provided, the second support portion being for supporting the first upper portion from below on an upper side of the second lower portion when the first transport apparatus is positioned on the second side relative to the second position, the third support portion being for supporting the second upper portion from below on an upper side of the first lower portion when the second transport apparatus is positioned on the first side relative to the first position, the second support portion is configured so that at least one of an orientation and an installation position thereof can be switched between a second support position and a second withdrawal position, the second support position being a position at which the second support portion supports the first upper portion from below, the position being within a second movement space, which is a space in which the second fold-back portion moves when the second transport apparatus moves in the second movement area, and the second withdrawal position being outside the second movement space, and the third support portion is configured so that at least one of an orientation and an installation position thereof can be switched between a third support position and a third withdrawal position, the third support position being a position at which the third support portion supports the second upper portion from below, the position being within a first movement space, which is a space in which the first fold-back portion moves when the first transport apparatus moves in the first movement area, and the third withdrawal position being outside the first movement space.

4. The article transport facility according to claim 3, wherein the second support portion is provided at a plurality of positions on the second side relative to the second position, and the third support portion is provided at a plurality of positions on the first side relative to the first position, and wherein a first sensor and a second sensor are provided, the first sensor being for projecting a detection light beam in the first direction and detecting that at least one second support portion is positioned at the second support position, and the second sensor being for projecting a detection light beam in the first direction and detecting that at least one third support portion is positioned at the third support position.

5. The article transport facility according to claim 3, wherein the second support portion is provided at a plurality of positions on the second side relative to the second position, and the third support portion is provided at a plurality of positions on the first side relative to the first position, and wherein a third sensor and a fourth sensor are provided, the third sensor being for projecting a detection light beam in the first direction and detecting that at least one second support portion is positioned at the second withdrawal position, and the fourth sensor being for projecting a detection light beam in the first direction and detecting that at least one third support portion is positioned at the third withdrawal position.

6. The article transport facility according to claim 1, wherein the first cable body and the second cable body each include a cable main body and a cable carrier for accommodating the cable main body and restricting a direction in which the cable main body extends.

7. The article transport facility according to claim 1, further comprising:
a control apparatus for controlling operation of the first transport apparatus and the second transport apparatus,
wherein the first transport apparatus is arranged on a first side, which is one side in the first direction, relative to the second transport apparatus, and
wherein:
the control apparatus performs first transport control, second transport control, and third transport control,
a position within an area in which the first movement area and the second movement area overlap each other is a reference position such that the first transport control is control for causing both the first transport apparatus and the second transport apparatus to transport the articles, in a state where a movement area of the first transport apparatus is restricted to be within an area in the first movement area on the first side relative to the reference position, and in a state where a movement area of the second transport apparatus is restricted be within an area in the second movement area on a second side opposite to the first side relative to the reference position,
the second transport control is control for causing the first transport apparatus to transport the articles, in a state of allowing the first transport apparatus to move throughout the entire first movement area with only the first transport apparatus, of the first transport apparatus and the second transport apparatus, being present in the first movement area, and the third transport control is control for causing the second transport apparatus to transport the articles, in a state of allowing the second transport apparatus to move throughout the entire second movement area with only the second transport apparatus, of the first transport apparatus and the second transport apparatus, being present in the second movement area.

* * * * *